(12) United States Patent
Tsai et al.

(10) Patent No.: US 12,353,011 B2
(45) Date of Patent: Jul. 8, 2025

(54) PHOTONIC PACKAGE AND METHOD OF MANUFACTURE

(71) Applicant: Taiwan Semiconductor Manufacturing Co., Ltd., Hsinchu (TW)

(72) Inventors: Tsung-Fu Tsai, Changhua (TW); Hsing-Kuo Hsia, Jhubei (TW); Szu-Wei Lu, Hsinchu (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 71 days.

(21) Appl. No.: 17/809,122

(22) Filed: Jun. 27, 2022

(65) Prior Publication Data
US 2023/0417993 A1      Dec. 28, 2023

(51) Int. Cl.
  *G02B 6/136*   (2006.01)
  *G02B 6/12*    (2006.01)
  *G02B 6/124*   (2006.01)

(52) U.S. Cl.
  CPC ............ *G02B 6/136* (2013.01); *G02B 6/124* (2013.01); *G02B 2006/12061* (2013.01); *G02B 2006/12121* (2013.01); *G02B 2006/12123* (2013.01)

(58) Field of Classification Search
  CPC .......... G02B 6/136; G02B 6/124; G02B 6/30; G02B 6/4214; G02B 6/4274; G02B 6/12004; G02B 2006/12061; G02B 2006/12121; G02B 2006/12123; H01L 23/5389; H01L 24/19; H01S 5/02251;
  (Continued)

(56) References Cited

U.S. PATENT DOCUMENTS 9,863,880 B2 * 1/2018 Rothberg .............. B01L 3/5085
10,746,923 B2 * 8/2020 Yu ........................ G02B 6/1228
(Continued)

FOREIGN PATENT DOCUMENTS

| CN | 110785900 A | 2/2020 |
| CN | 113764392 A | 12/2021 |
| TW | 202029602 A | 8/2020 |

OTHER PUBLICATIONS

Beeck, Camiel Op De et al., "Heterogeneous III-V on Silicon Nitride Amplifiers and Lasers via Microtransfer Printing," Optica, Research Article, vol. 7, No. 5, May 2020, pp. 386-393.
(Continued)

*Primary Examiner* — Ryan A Lepisto
*Assistant Examiner* — Erin D Chiem
(74) *Attorney, Agent, or Firm* — Slater Matsil, LLP

(57) ABSTRACT

A package includes a laser diode includes a bonding layer; a first dielectric layer over the laser diode, wherein the first dielectric layer is directly bonded to the bonding layer of the laser diode; a first silicon nitride waveguide in the first dielectric layer, wherein the first silicon nitride waveguide extends over the laser diode; a second dielectric layer over the first silicon nitride waveguide; a silicon waveguide in the second dielectric layer; an interconnect structure over the silicon waveguide; and conductive features extending through the first dielectric layer and the second dielectric layer to electrically contact the interconnect structure.

20 Claims, 26 Drawing Sheets

(58) Field of Classification Search
CPC ............ H01S 5/02253; H01S 5/02345; H01S 5/04256
See application file for complete search history.

(56) References Cited

U.S. PATENT DOCUMENTS

| | | |
|---|---|---|
| 2017/0237229 A1* | 8/2017 | Menezo .................. H01S 5/021 385/3 |
| 2020/0166703 A1 | 5/2020 | Charles et al. |
| 2021/0088723 A1* | 3/2021 | Yu ...................... G02B 6/12004 |
| 2021/0151950 A1 | 5/2021 | Menezo et al. |
| 2022/0099887 A1 | 3/2022 | Yu et al. |
| 2023/0080454 A1* | 3/2023 | Pietambaram ....... G02B 6/4274 385/14 |

OTHER PUBLICATIONS

Duan, Guang-Hua et al., "Hybrid III-V on Silicon Lasers for Photonic Integrated Circuits on Silicon," IEEE Journal of Selected Topics in Quantum Electronics, vol. 20, No. 4, Jul./Aug. 2014, pp. 1-14.

Hu, Yingtao et al., "III/V-on Si MQW Lasers by Using a Novel Photonic Integration Method of Regrowth on a Bonding Template," Article Open Access, Light: Science & Applications, Official Journal of the CIOMP, 2019, pp. 1-9.

Liang, Di et al., "Recent Progress in Hetergeneous III-V-on-Silicon Photonic Integration," Review Open Access, Light: Advanced Manufacturing, Official Journal of the JHL, 2021, pp. 1-25.

Thiessen, Torrey et al., "Back-Side-on-Box Heterogeneously Integrated III-V-on-Silicon O-Band Discrete-Mode Lasers," Optics Express Research Article, vol. 28, No. 26, Dec. 21, 2020, pp. 38579-38591.

* cited by examiner

PHOTONIC PACKAGE AND METHOD OF MANUFACTURE

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating optical components and electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
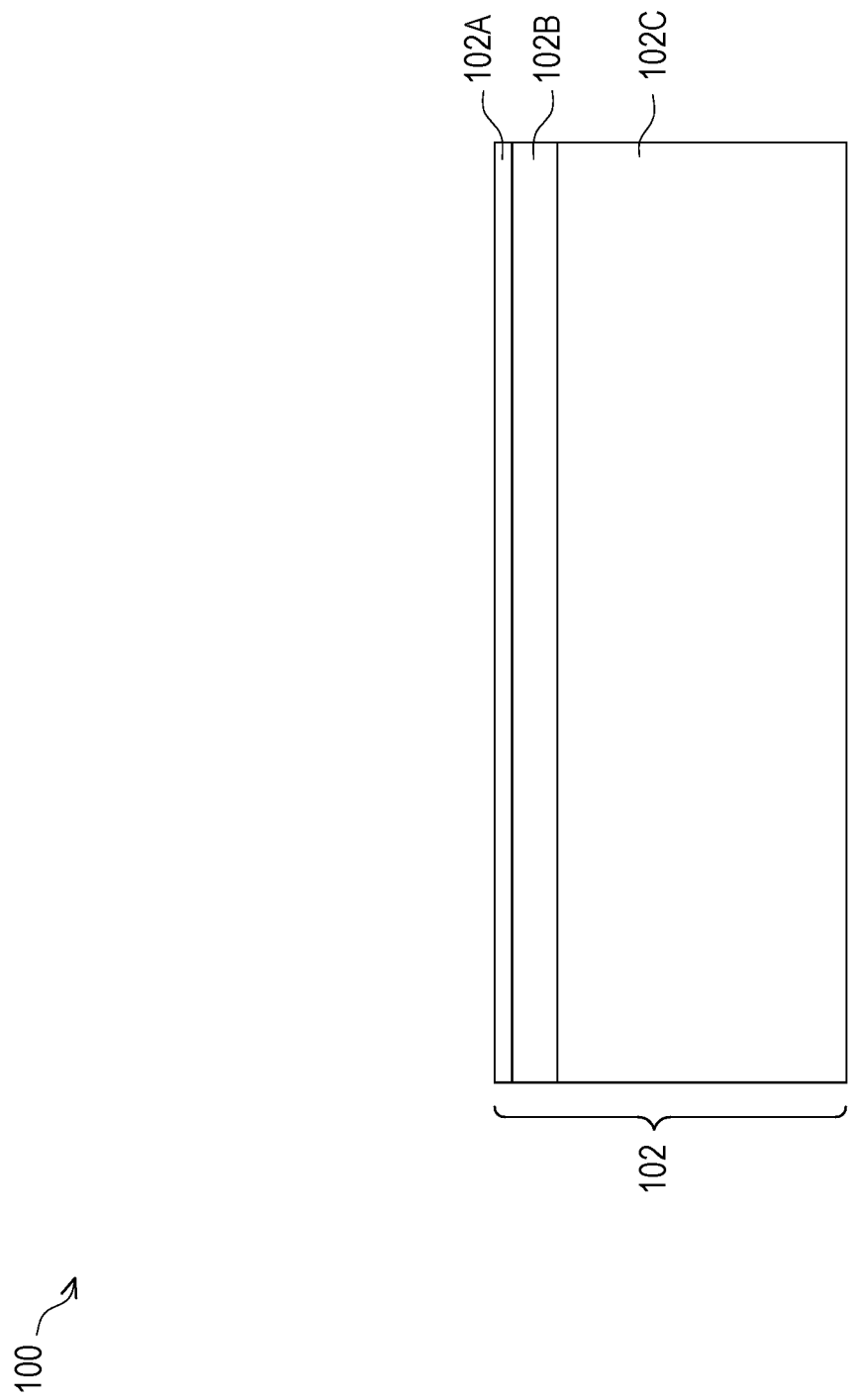
FIGS. 1 through 23 illustrate cross-sectional views of a photonic package at various stages of manufacturing, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the description herein, unless otherwise specified, the same or similar reference numerals in different figures refer to the same or similar element formed by a same or similar formation method using a same or similar material(s).

In aspects of this disclosure, a photonic package includes silicon and silicon nitride waveguides with an integrated laser diode. The laser diode may be formed by bonding a laser substrate die to the structure and then processing the laser substrate die to form the laser diode. This allows for the heterogeneous integration of a laser diode within a photonic package, in some cases. The disclosed interposer allows for highly efficient edge-mount optical fiber and/or vertically-mounted optical fiber to be used in the semiconductor package for communication with external devices, and allow for greatly design flexibility. This can allow for reduced manufacturing cost, improved optical coupling, and improved device performance of a photonic package.

FIGS. 1 through 23 illustrate cross-sectional views of a photonic package 100 at various stages of manufacturing, in accordance with an embodiment. In some cases, the photonic package 100 (also referred to as an optical engine) may be part of a semiconductor package or other structure. In some embodiments, the photonic package 100 provides an input/output (I/O) interface between optical signals and electrical signals in a semiconductor package. In some embodiments, the photonic package 100 provides an optical network for signal communication between components (e.g., photonic devices, integrated circuits, couplings to external fibers, etc.) within the photonic package 100.

Turning first to FIG. 1, a buried oxide ("BOX") substrate 102 is provided, in accordance with some embodiments. The BOX substrate 102 includes an oxide layer 102B formed over a substrate 102C, and a silicon layer 102A formed over the oxide layer 102B. The substrate 102C may be, for example, a material such as a glass, ceramic, dielectric, a semiconductor, the like, or a combination thereof. In some embodiments, the substrate 102C may be a semiconductor substrate, such as a bulk semiconductor or the like, which may be doped (e.g., with a p-type or an n-type dopant) or undoped. The substrate 102C may be a wafer, such as a silicon wafer (e.g., a 12-inch silicon wafer). Other substrates, such as a multi-layered or gradient substrate may also be used. In some embodiments, the semiconductor material of the substrate 102C may include silicon; germanium; a compound semiconductor including silicon carbide, gallium arsenic, gallium phosphide, indium phosphide, indium arsenide, and/or indium antimonide; an alloy semiconductor including silicon germanium, GaAsP, AlInAs, AlGaAs, GaInAs, GaInP, and/or GaInAsP; or combinations thereof. The oxide layer 102B may be, for example, a silicon oxide or the like. In some embodiments, the oxide layer 102B may have a thickness between about 0.5 μm and about 4 μm, in some embodiments. The silicon layer 102A may have a thickness between about 0.1 μm and about 1.5 μm, in some embodiments. Other thicknesses are possible. The BOX substrate 102 may be referred to as having a front side or front surface (e.g., the side facing upwards in FIG. 1), and a back-side or back surface (e.g., the side facing downwards in FIG. 1).

Figure 2:
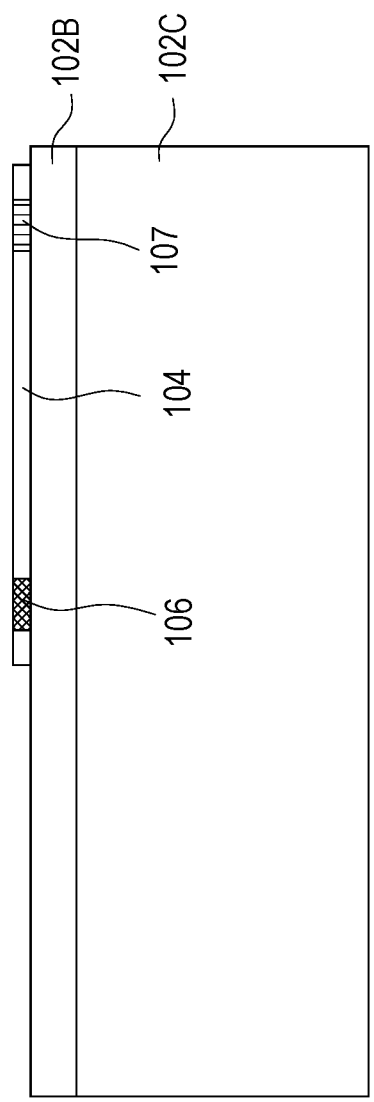

In FIG. 2, the silicon layer 102A is patterned to form silicon regions for waveguides 104, photonic components 106, and grating couplers 107, in accordance with some embodiments. The silicon layer 102A may be patterned using suitable photolithography and etching techniques. For example, a hardmask layer (e.g., a nitride layer or other dielectric material, not shown in FIG. 2) may be formed over the silicon layer 102A and patterned, in some embodiments.

The pattern of the hardmask layer may then be transferred to the silicon layer 102A using an etching process. The etching process may include, for example, a dry etching process and/or a wet etching process. For example, the silicon layer 102A may be etched to form recesses defining the waveguides 104 (also referred to as silicon waveguides 104), with sidewalls of the remaining unrecessed portions defining sidewalls of the waveguides 104. In some embodiments, more than one photolithography and etching sequence may be used in order to pattern the silicon layer 102A. One waveguide 104 or multiple waveguides 104 may be patterned from the silicon layer 102A. If multiple waveguides 104 are formed, the multiple waveguides 104 may be individual separate waveguides 104 or connected as a single continuous structure. In some embodiments, one or more of the waveguides 104 form a continuous loop. Other configurations or arrangements of waveguides 104, the photonic components 106, or the grating couplers 107 are possible, and other types of photonic components 106 or photonic structures may be formed. In some cases, the waveguides 104, the photonic components 106, and the grating couplers 107 may be collectively referred to as "the photonic layer."

The photonic components 106 may be integrated with the waveguides 104, and may be formed with the silicon waveguides 104. The photonic components 106 may be optically coupled to the waveguides 104 to interact with optical signals within the waveguides 104. The photonic components 106 may include, for example, photonic devices such as photodetectors and/or modulators. For example, a photodetector may be optically coupled to the waveguides 104 to detect optical signals within the waveguides 104 and generate electrical signals corresponding to the optical signals. A modulator may be optically coupled to the waveguides 104 to receive electrical signals and generate corresponding optical signals within the waveguides 104 by modulating optical power within the waveguides 104. In this manner, the photonic components 106 facilitate the input/output (I/O) of optical signals to and from the waveguides 104. In other embodiments, the photonic components may include other active or passive components, such as laser diodes, optical signal splitters, or other types of photonic structures or devices. Optical power may be provided to the waveguides 104 by, for example, a laser diode (e.g., laser diode 162 in FIG. 19).

In some embodiments, the photodetectors may be formed by, for example, partially etching regions of the waveguides 104 and growing an epitaxial material on the remaining silicon of the etched regions. The waveguides 104 may be etched using acceptable photolithography and etching techniques. The epitaxial material may comprise, for example, a semiconductor material such as germanium, which may be doped or undoped. In some embodiments, an implantation process may be performed to introduce dopants within the silicon of the etched regions as part of the formation of the photodetectors. The silicon of the etched regions may be doped with p-type dopants, n-type dopants, or a combination. In some embodiments, the modulators may be formed by, for example, partially etching regions of the waveguides 104 and then implanting appropriate dopants within the remaining silicon of the etched regions. The waveguides 104 may be etched using acceptable photolithography and etching techniques. In some embodiments, the etched regions used for the photodetectors and the etched regions used for the modulators may be formed using one or more of the same photolithography or etching steps. The silicon of the etched regions may be doped with p-type dopants, n-type dopants, or a combination. In some embodiments, the etched regions used for the photodetectors and the etched regions used for the modulators may be implanted using one or more of the same implantation steps.

In some embodiments, one or more grating couplers 107 may be integrated with the waveguides 104, and may be formed with the waveguides 104. The grating couplers 107 are photonic structures that allow optical signals and/or optical power to be transferred between the waveguides 104 and a photonic component such as a vertically-mounted optical fiber (e.g., the optical fiber 170 shown in FIG. 23) or a waveguide of another photonic system. The grating couplers 107 may be formed using acceptable photolithography and etching techniques. In an embodiment, the grating couplers 107 are formed after the waveguides 104 are defined. For example, a photoresist may be formed on the waveguides 104 and patterned. The photoresist may be patterned with openings corresponding to the grating couplers 107. One or more etching processes may be performed using the patterned photoresist as an etching mask to form recesses in the waveguides 104 that define the grating couplers 107. The etching processes may include one or more dry etching processes and/or wet etching processes. In some embodiments, other types of couplers (not individually labeled in the figures) may be formed, such as a structure that couples optical signals between the waveguides 104 and other waveguides of the photonic package 100, such as nitride waveguides 134A (see FIG. 15). Edge couplers may also be formed that allow optical signals and/or optical power to be transferred between the waveguide 104 and a photonic component that is horizontally mounted near a sidewall of the photonic package 100. These and other photonic structures are considered within the scope of the present disclosure.

Figure 3:
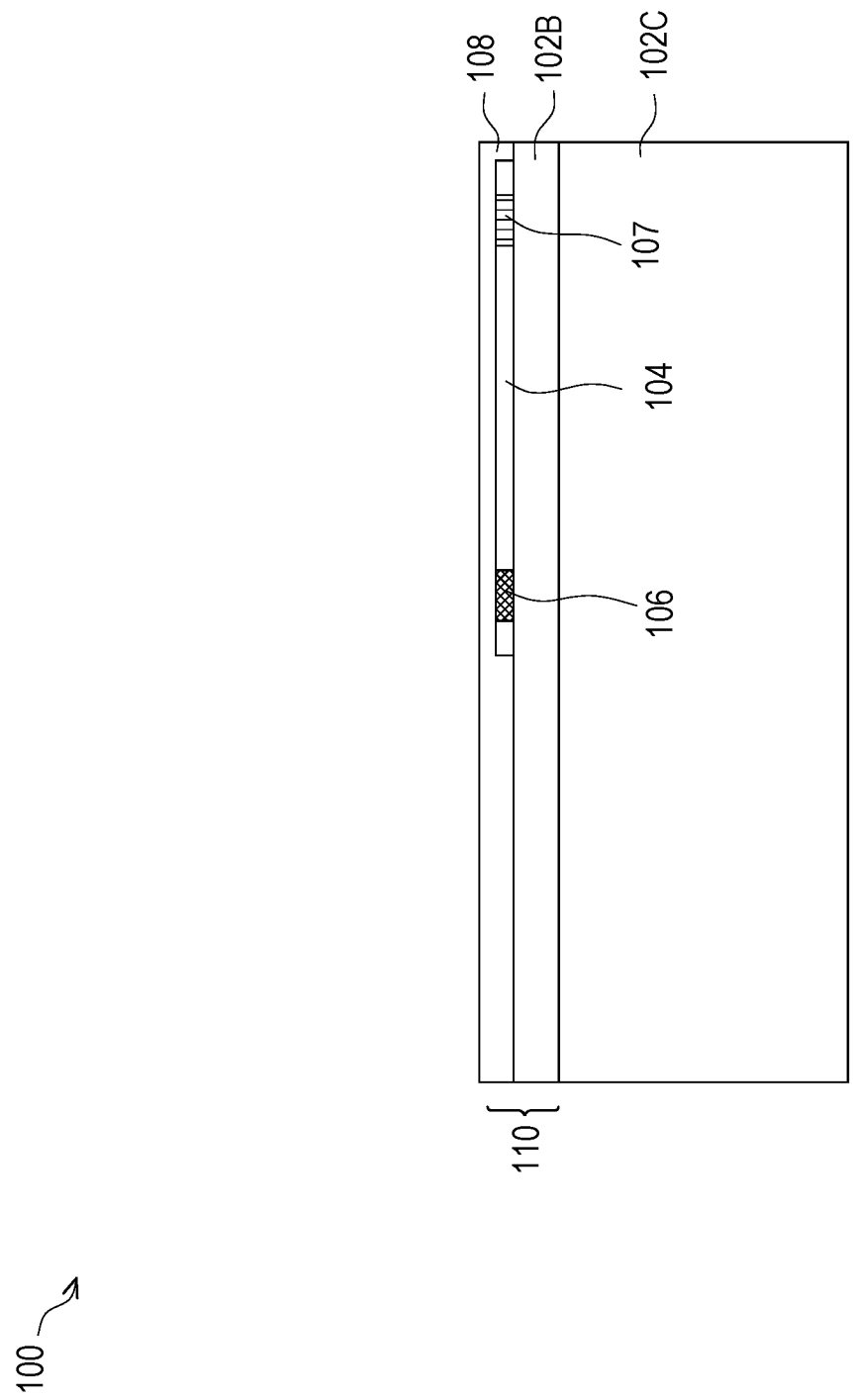

In FIG. 3, a dielectric layer 108 is formed on the front side of the BOX substrate 102 to form a photonic routing structure 110, in accordance with some embodiments. The dielectric layer 108 is formed over the waveguides 104, the photonic components 106, the grating couplers 107, and the oxide layer 102B. The dielectric layer 108 may be formed of one or more layers of silicon oxide, silicon nitride, a combination thereof, or the like, and may be formed by CVD, PVD, atomic layer deposition (ALD), a spin-on-dielectric process, the like, or a combination thereof. In some embodiments, the dielectric layer 108 may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other dielectric materials formed by any acceptable process may be used. In some embodiments, the dielectric layer 108 is then planarized using a planarization process such as a chemical-mechanical polish (CMP) process, a grinding process, or the like. The dielectric layer 108 may be formed having a thickness over the oxide layer 102B between about 50 nm and about 500 nm, or may be formed having a thickness over the waveguides 104 between about 10 nm and about 200 nm, in some embodiments. In some cases, a thinner dielectric layer 108 may allow for more efficient optical coupling between a grating coupler 107 and a vertically-mounted photonic component, or more efficient optical coupling between the waveguides 104 and overlying waveguides, such as the nitride waveguides 134 described below (see FIG. 15).

Due to the difference in refractive indices of the materials of the waveguides 104 and dielectric layer 108, the waveguides 104 have high internal reflections such that light is substantially confined within the waveguides 104, depending on the wavelength of the light and the refractive indices of the respective materials. In an embodiment, the refractive index of the material of the waveguides 104 is higher than the refractive index of the material of the dielectric layer 108. For example, the waveguides 104 may comprise silicon, and the dielectric layer 108 may comprise silicon oxide and/or silicon nitride.

Figure 4:
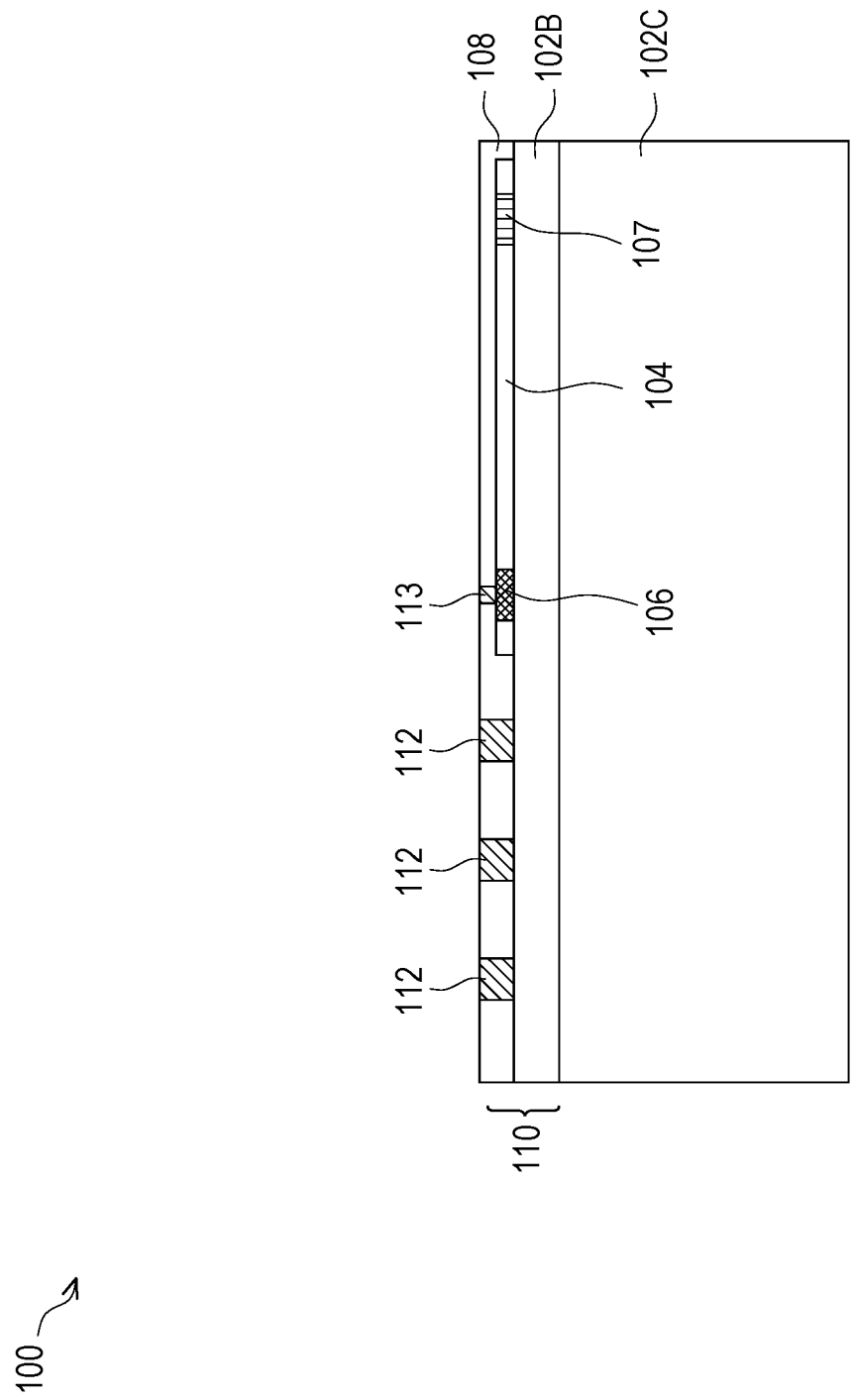

In FIG. 4, vias 112 and contacts 113 are formed in the dielectric layer 108, in accordance with some embodiments. In some embodiments, the vias 112 and contacts 113 are formed as part of forming the redistribution structure 120 (see FIG. 5), and in other embodiments, the vias 112 are not formed. In some embodiments, the vias 112 are formed by a damascene process, e.g., single damascene, dual damascene, or the like. The vias 112 may be formed, for example, by forming openings extending through the dielectric layer 108. In some embodiments, the openings may extend partially into the oxide layer 102B or fully through the oxide layer 102B to expose the substrate 102C. In some embodiments, the openings may extend partially into the substrate 102C. The openings may be formed using acceptable photolithography and etching techniques, such as by forming and patterning a photoresist and then performing an etching process using the patterned photoresist as an etching mask. The etching process may include, for example, a dry etching process and/or a wet etching process.

A conductive material may then be formed in the openings, thereby forming vias 112, in accordance with some embodiments. In some embodiments, a liner (not shown), such as a diffusion barrier layer, an adhesion layer, or the like, may be formed in the openings from tantalum, tantalum nitride, titanium, titanium nitride, CoW, or the like, and may be formed using suitable a deposition process such as ALD or the like. In some embodiments, a seed layer (not shown), which may include copper or a copper alloy may then be deposited in the openings. The conductive material of the vias 112 may be formed in the openings using, for example, a plating process. The conductive material may include, for example, a metal or a metal alloy such as copper, silver, gold, tungsten, cobalt, aluminum, or alloys thereof. A planarization process (e.g., a CMP process or a grinding process) may be performed to remove excess conductive material along the top surface of the dielectric layer 108, such that top surfaces of the vias 112 and the dielectric layer 108 are level. The vias 112 may be formed using other techniques or materials in other embodiments.

In some embodiments, the contacts 113 extend through the dielectric layer 108 and are electrically connected to the photonic components 106. The contacts 113 allow electrical power or electrical signals to be transmitted to the photonic components 106 and electrical signals to be transmitted from the photonic components 106. In this manner, the photonic components 106 may convert electrical signals into optical signals transmitted by the waveguides 104, and/or may convert optical signals from the waveguides 104 into electrical signals. The contacts 113 may be formed before or after formation of the vias 112, and the formation of the contacts 113 and the formation of the vias 112 may share some steps such as deposition of the conductive material and/or planarization. In some embodiments, the contacts 113 are formed by a damascene process, e.g., single damascene, dual damascene, or the like. For example, in some embodiments, openings (not shown) for the contacts 113 are first formed in the dielectric layer 108 using acceptable photolithography and etching techniques. A conductive material may then be formed in the openings, forming the contacts 113. Excess conductive material may be removed using a CMP process or the like. The conductive material of the contacts 113 may be formed of a metal or a metal alloy including aluminum, copper, tungsten, or the like, which may be the same as that of the vias 112. The contacts 113 may be formed using other techniques or materials in other embodiments.

Figure 5:
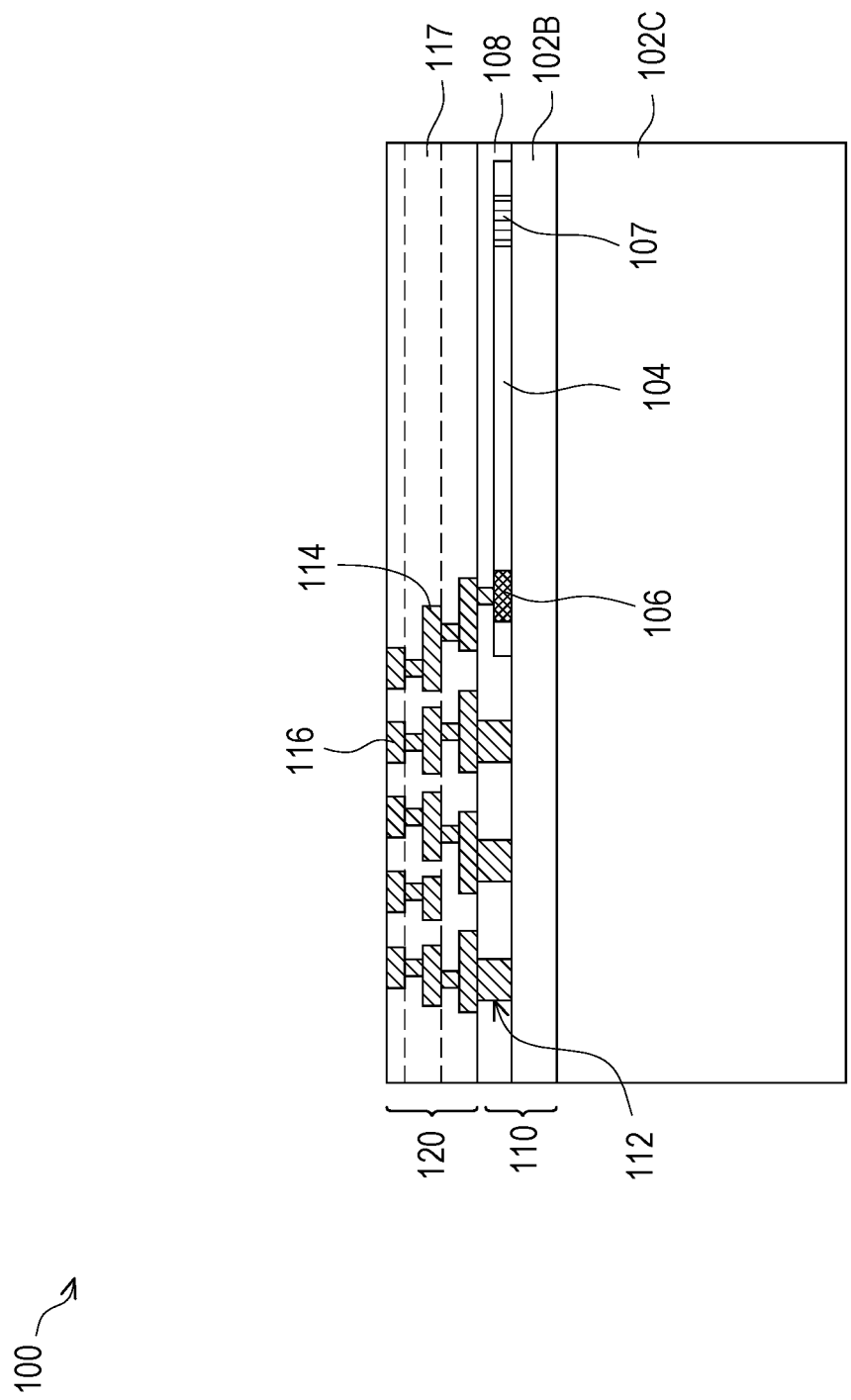

In FIG. 5, a redistribution structure 120 is formed over the dielectric layer 108, in accordance with some embodiments. The redistribution structure 120 is an interconnect structure that includes dielectric layers 117 and conductive features 114 formed in the dielectric layers 117 that provide interconnections and electrical routing. For example, the redistribution structure 120 may connect the vias 112, the contacts 113, and/or overlying devices such as electronic dies 122 (see FIG. 6). The dielectric layers 117 may be, for example, insulating or passivating layers, and may comprise one or more materials similar to those described above for the dielectric layer 108, such as a silicon oxide or a silicon nitride, or may comprise a different material. The dielectric layers 117 and the dielectric layer 108 may be transparent or nearly transparent to light within the same range of wavelengths. The dielectric layers 117 may be formed using a technique similar to those described above for the dielectric layer 108 or using a different technique. The conductive features 114 may include conductive lines and vias, and may be formed by a damascene process, e.g., single damascene, duel damascene, or the like. As shown in FIG. 5, conductive pads 116 are formed in the topmost layer of the dielectric layers 117. A planarization process (e.g., a CMP process or the like) may be performed after forming the conductive pads 116 such that surfaces of the conductive pads 116 and the topmost dielectric layer 117 are substantially coplanar. The redistribution structure 120 may include more or fewer dielectric layers 117, conductive features 114, or conductive pads 116 than shown in FIG. 5. The redistribution structure 120 may be formed having a thickness between about 4 μm and about 8 μm, in some embodiments. Other thicknesses are possible.

Figure 6:
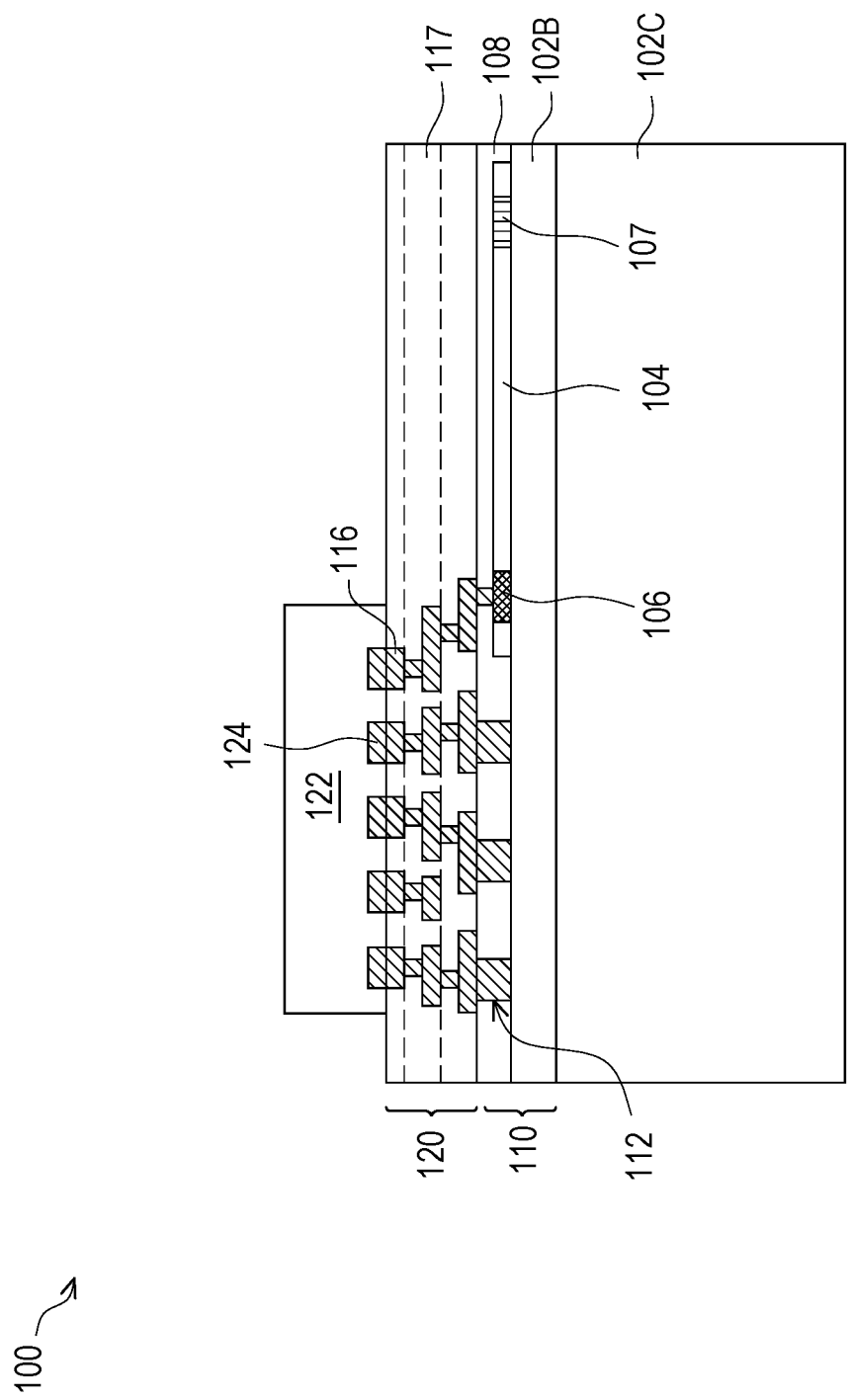

In FIG. 6, one or more electronic dies 122 are bonded to the redistribution structure 120, in accordance with some embodiments. The electronic die 122 may be, for example, semiconductor devices, dies, or chips that communicate with the photonic components 106 using electrical signals. In some embodiments, the electronic die 122 may process electrical signals received from photonic components 106 or may generate electrical signals that photonic components 106 convert into optical signals. One electronic die 122 is shown in FIG. 6, but a photonic package 100 may include two or more electronic dies 122 in other embodiments. In some cases, multiple electronic dies 122 may be incorporated into a single photonic package 100 in order to reduce processing cost or increase functionality. The electronic die 122 includes die connectors 124, which may be, for example, conductive pads, conductive pillars, or the like. In some embodiments, the electronic die 122 may have a thickness between about 10 μm and about 35 μm, such as about 25 μm. Other thicknesses are possible.

The electronic die 122 may include integrated circuits for interfacing with the photonic components 106, such as circuits for controlling the operation of the photonic components 106. For example, the electronic die 122 may include controllers, drivers, transimpedance amplifiers, the like, or combinations thereof. The electronic die 122 may include a CPU or memory functionality, in some embodiments. In some embodiments, the electronic die 122 includes circuits for processing electrical signals received from photonic components 106, such as for processing electrical signals received from a photonic component 106 comprising a photodetector. The electronic die 122 may control high-frequency signaling of the photonic components 106 according to electrical signals (digital or analog) received from another device or die, in some embodiments. In some embodiments, the electronic die 122 may be an electronic integrated circuit (EIC) or the like that provides Serializer/Deserializer (SerDes) functionality. In this manner, the electronic die 122 may act as part of an I/O interface between optical signals and electrical signals within a photonic package 100. In cases, the photonic packages 100 described herein can be considered system-on-chip (SoC) or system-on-integrated-circuit (SoIC) devices.

In some embodiments, the electronic die 122 is bonded to the redistribution structure 120 using dielectric-to-dielectric bonding and/or metal-to-metal bonding (e.g., direct bonding, fusion bonding, oxide-to-oxide bonding, hybrid bonding, or the like). In such embodiments, dielectric-to-dielectric bonding may occur between the topmost dielectric layer 117 and a bonding layer (not individually shown) of the electronic die 122. During the bonding, metal-to-metal bonding may also occur between the die connectors 124 of the electronic die 122 and the conductive pads 116 of the redistribution structure 120.

In some embodiments, before performing the bonding process, a surface treatment is performed on the redistribution structure 120 and/or the electronic die 122. In some embodiments, the bonding surfaces of the redistribution structure 120 and/or the electronic die 122 may first be activated utilizing, for example, a dry treatment, a wet treatment, a plasma treatment, exposure to an inert gas, exposure to $H_2$, exposure to $N_2$, exposure to $O_2$, the like, or a combination thereof. However, any suitable activation process may be utilized. After the activation process, the redistribution structure 120 and/or the electronic die 122 may be cleaned using, e.g., a chemical rinse. The electronic die 122 is then aligned with the redistribution structure 120 and placed into physical contact with the redistribution structure 120. The electronic die 122 may be placed on the redistribution structure 120 using a pick-and-place process, for example. The redistribution structure 120 and the electronic die 122 may then be subjected to a thermal treatment and/or pressed against each other (e.g., by applying contact pressure) to bond the redistribution structure 120 and the electronic die 122. For example, the redistribution structure 120 and the electronic die 122 may be subjected to a pressure of about 200 kPa or less, and to a temperature between about 200° C. and about 400° C. The redistribution structure 120 and the electronic die 122 may then be subjected to a temperature at or above the eutectic point of the material of the conductive pads 116 and the die connectors 124 (e.g., between about 150° C. and about 650° C.) to fuse the conductive pads 116 and the die connectors 124. In this manner, the dielectric-to-dielectric bonding and/or metal-to-metal bonding of the redistribution structure 120 and the electronic die 122 forms a bonded structure. In some embodiments, the bonded structure is baked, annealed, pressed, or otherwise treated to strengthen or finalize the bonds.

Figure 7:
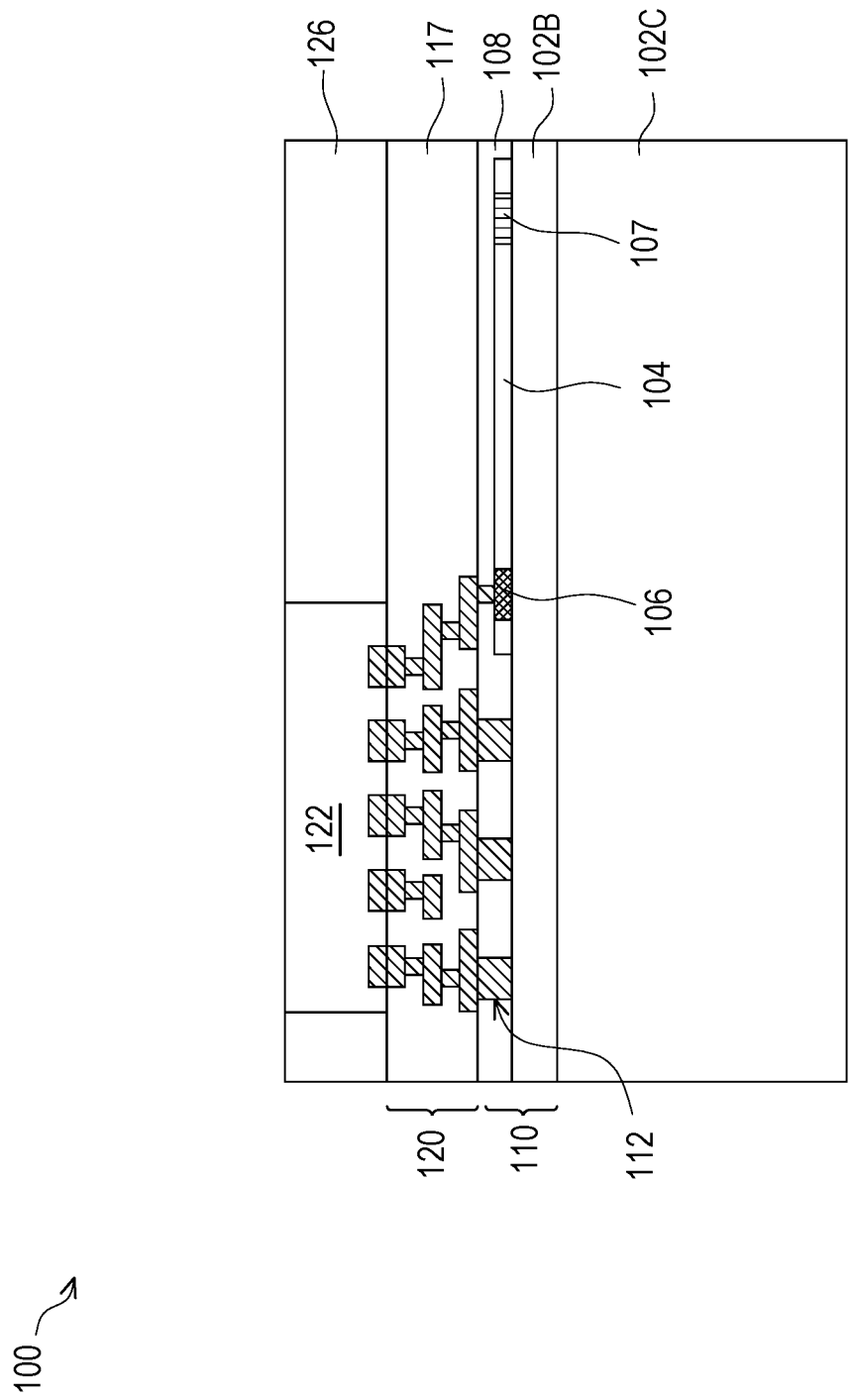

In FIG. 7, a dielectric material 126 is formed over the electronic dies 122 and the redistribution structure 120, in accordance with some embodiments. The dielectric material 126 may be formed of silicon oxide, silicon nitride, a polymer, the like, or a combination thereof. The dielectric material 126 may be formed by CVD, PVD, ALD, a spin-on process, the like, or a combination thereof. In some embodiments, the dielectric material 126 may be formed by HDP-CVD, FCVD, PECVD, the like, or a combination thereof. The dielectric material 126 may be a gap-fill material in some embodiments, which may include one or more of the example materials above. In some embodiments, the dielectric material 126 may be a material (e.g., silicon oxide) that is substantially transparent to light at wavelengths suitable for transmitting optical signals or optical power between the grating coupler 107 and a vertically-mounted optical fiber (e.g., optical fiber 170 in FIG. 23). In some embodiments in which a grating coupler 107 is not present, the dielectric material 126 may comprise a relatively opaque material such as an encapsulant, molding compound, or the like. Other dielectric materials formed by any acceptable processes may be used. The dielectric material 126 may be planarized using a planarization process such as a CMP process, a grinding process, or the like. In some embodiments, the planarization process may expose the electronic dies 122 such that surfaces of the electronic dies 122 and surfaces of the dielectric material 126 are coplanar.

The use of dielectric-to-dielectric bonding may allow for materials transparent to the relevant wavelengths of light to be deposited over the redistribution structure 120 and/or around the electronic die 122 instead of opaque materials such as an encapsulant or a molding compound. For example, the dielectric material 126 may be formed from a suitably transparent material such as silicon oxide instead of an opaque material such as a molding compound. The use of a suitably transparent material for the dielectric material 126 in this manner allows optical signals to be transmitted through the dielectric material 126, such as transmitting optical signals between a grating coupler 107 and a vertically-mounted optical fiber (e.g., optical fiber 170 in FIG. 23) located above the dielectric material 126. Additionally, by directly bonding the electronic die 122 to the redistribution structure 120 in this manner, the thickness of the resulting photonic package 100 may be reduced, and the optical coupling between a grating coupler 107 and a vertically-mounted optical fiber may be improved. In some cases, this can reduce the size or processing cost of a photonic package, and the optical coupling to external components may be improved.

Figure 8:
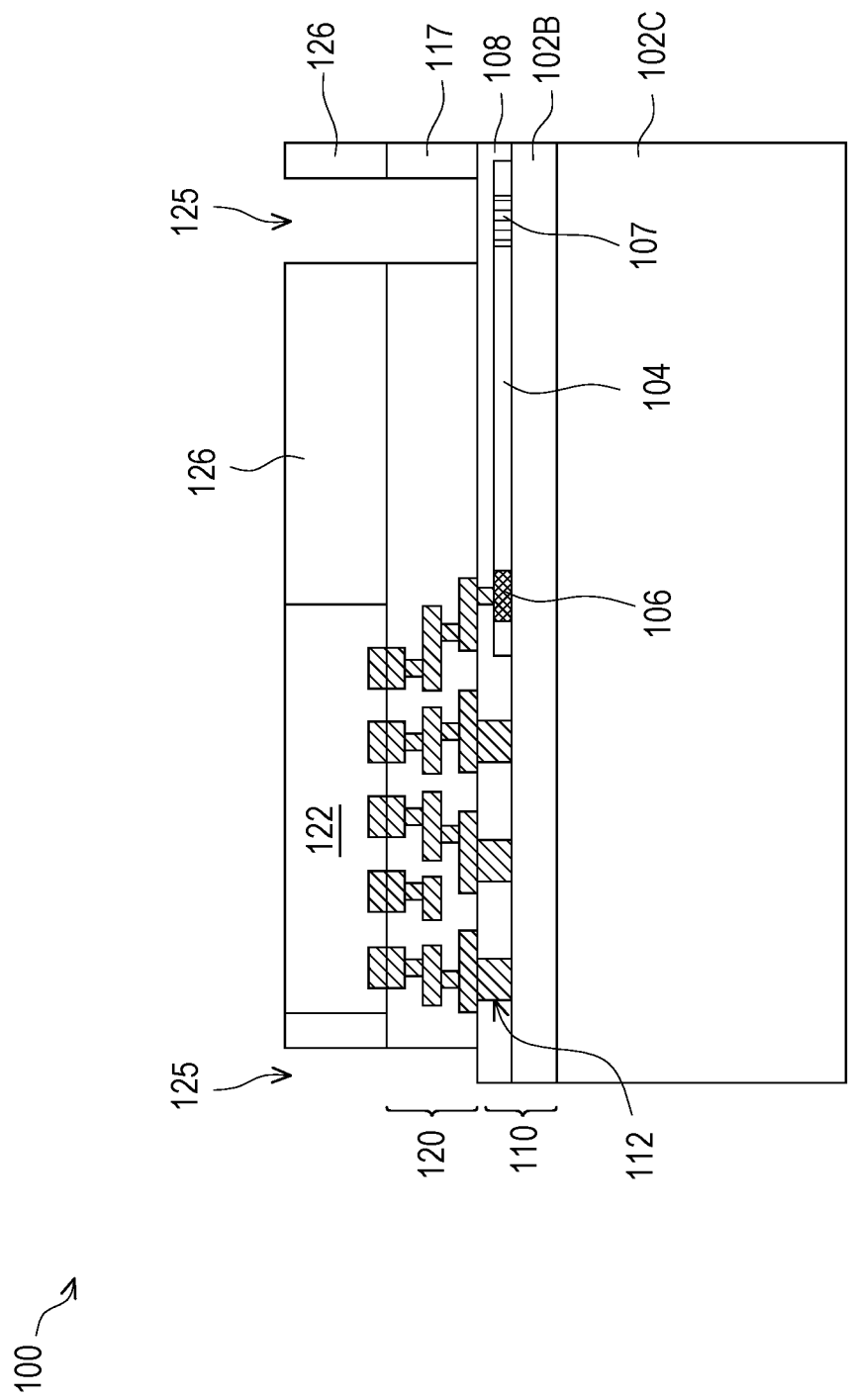
Figure 9:
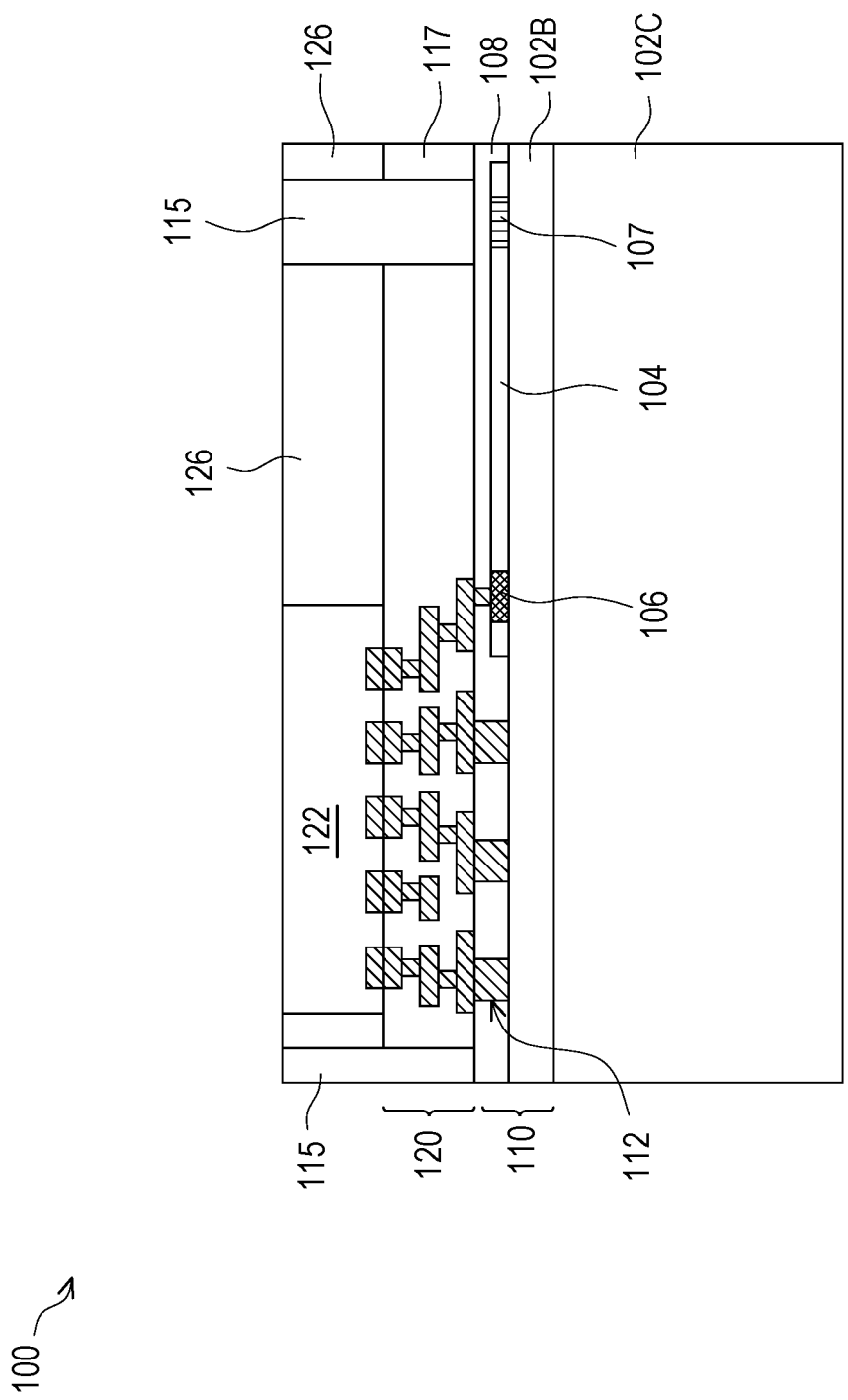

In FIGS. 8 and 9, portions of the redistribution structure 120 and the dielectric material 126 are removed and replaced by a dielectric layer 115, in accordance with some embodiments. In other embodiments, portions of the redistribution structure 120 and the dielectric material 126 are not removed and the dielectric layer 115 is not formed. In some embodiments, the removed portions of the redistribution structure 120 and the dielectric material 126 may be above or approximately above a grating coupler 107. In this manner, the material of the dielectric layer 115 is deposited over the grating coupler 107. In some cases, the material of the dielectric layer 115 may be chosen to provide a more efficient optical coupling between a grating coupler 107 and a vertically-mounted optical fiber (e.g., optical fiber 170 in FIG. 23) than the material of the dielectric layers 117 of the redistribution structure 120 or of the dielectric material 126. For example, the dielectric layer 115 may be more transparent, less lossy, or less reflective than the dielectric layers 117 or the dielectric material 126. In some embodiments, the material of the dielectric layer 115 is similar to that of the dielectric layers 117 and/or the dielectric material 126, but is deposited using a technique that results in the material having a better quality (e.g., less impurities, dislocations, etc.). In this manner, forming the dielectric layer 115 may allow for more efficient operation of the photonic package 100, and may reduce optical signal loss.

Referring to FIG. 8, portions of the redistribution structure 120 and dielectric material 126 are removed, forming recesses 125. The portions of the redistribution structure 120 and dielectric material 126 may be removed, for example, using acceptable photolithography and etching techniques, such as by forming and patterning a photoresist and then performing an etching process to remove the dielectric material 126 and dielectric layers 117 using the patterned photoresist as an etching mask. The etching process may include, for example, a dry etching process and/or a wet etching process. The etching process may stop on the dielectric layer 108 such that the recesses 125 expose the dielectric layer 108, in some embodiments.

Turning to FIG. 9, the dielectric layer 115 is deposited in the recesses 125, in accordance with some embodiments. The dielectric layer 115 may comprise one or more materials similar to those described above for the dielectric layer 108, such as a silicon oxide or a silicon nitride, a spin-on glass, or a different material. The dielectric layer 115 and the dielectric layer 108 may be transparent or nearly transparent to light within the same range of wavelengths. The dielectric layer 115 may be formed using a technique similar to those described above for the dielectric layer 108 or using a different technique. For example, the dielectric layer 115 may be formed using CVD, PVD, ALD, spin-on, or the like, though another technique may be used. In some embodiments, a planarization process (e.g., a CMP or grinding process) is used to remove excess material of the dielectric layer 115. After performing the planarization process, the dielectric layer 115, the dielectric material 126, and/or the electronic die(s) 122 may have substantially level surfaces.

In other embodiments, the redistribution structure 120 is not etched and the dielectric layer 115 is not formed. In these embodiments, regions of the redistribution structure 120 may be substantially free of the conductive features 114 or conductive pads 116 in order to allow transmission of optical power or optical signals through the dielectric layers 117. For example, these metal-free regions may extend between a grating coupler 107 and a vertically-mounted optical fiber (e.g., optical fiber 170 in FIG. 23) to allow optical power or optical signals to be coupled between the waveguides 104 and the optical fiber. In these embodiments, a thinner redistribution structure 120 may allow for more efficient optical coupling between a grating coupler 107 and a vertically-mounted optical fiber.

Figure 10:
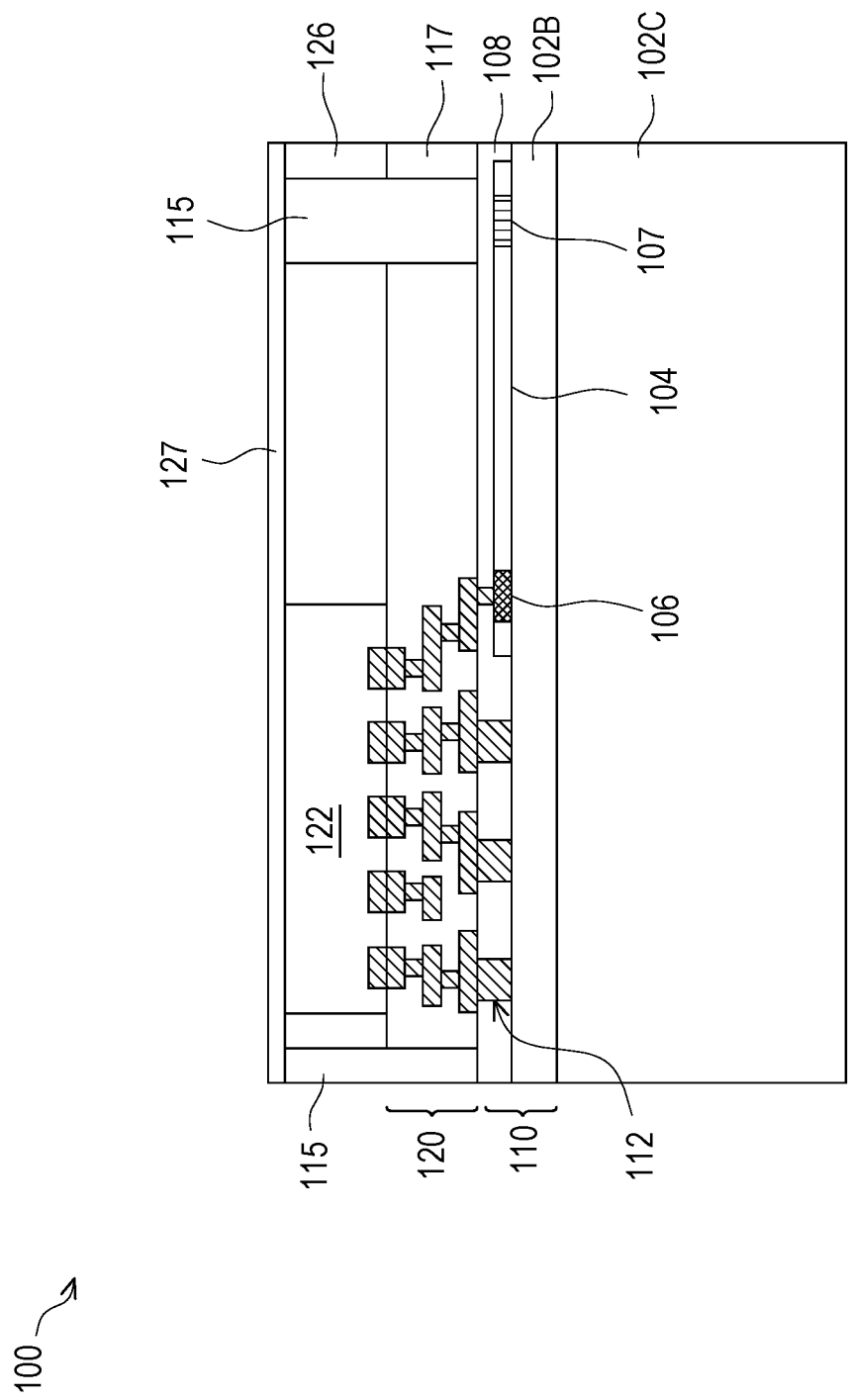
Figure 11:
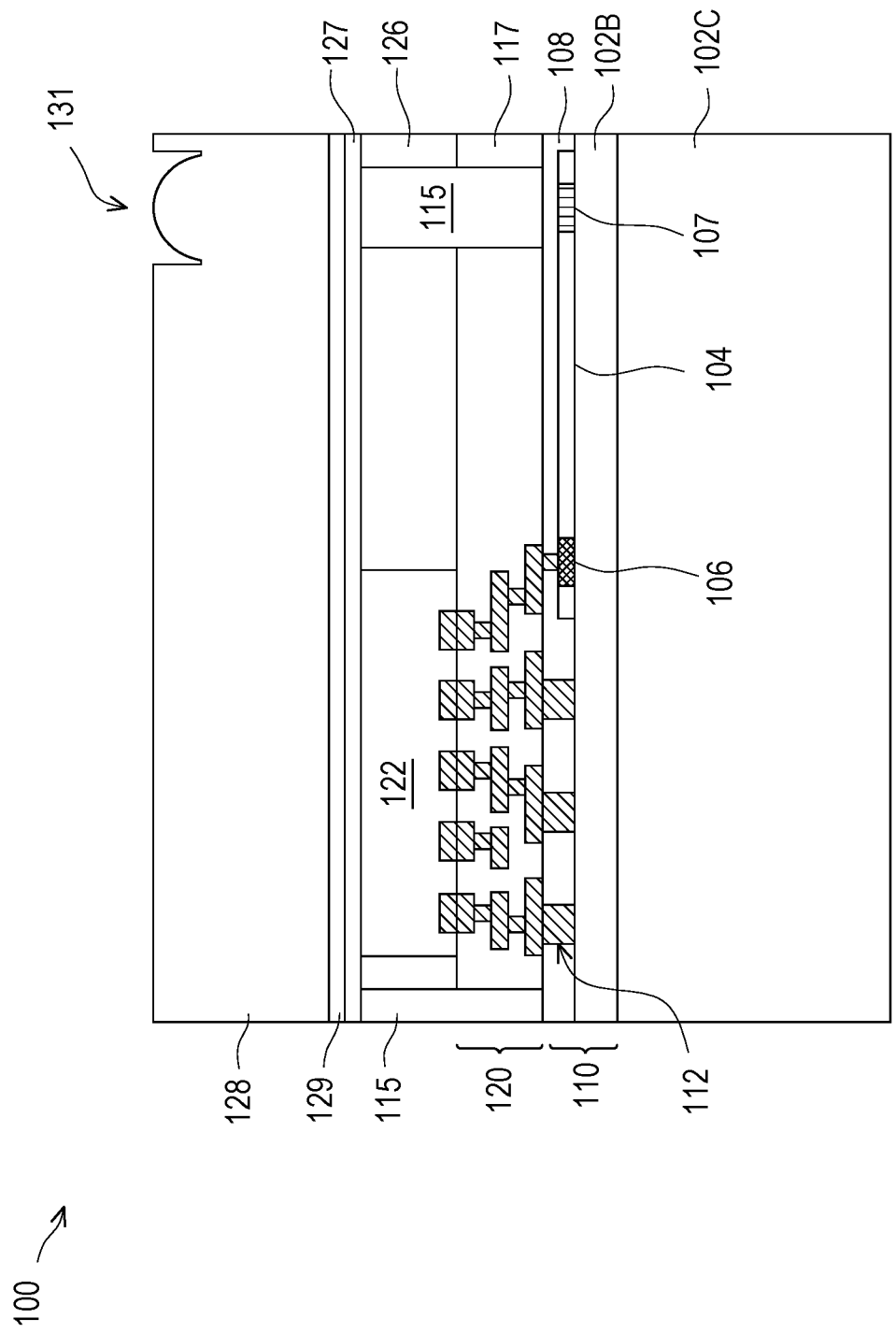

In FIGS. 10 and 11, an optional support 128 is attached to the structure, in accordance with some embodiments. The support 128 is a rigid structure that is attached to the structure in order to provide structural or mechanical stability. The use of a support 128 can reduce warping or bending, which can improve the performance of the optical structures such as the waveguides 104 or photonic components 106. The support 128 may be attached to the structure (e.g., to the dielectric material 126 and/or the electronic dies 122) using an bonding layer 127. FIG. 10 illustrates the bonding layer 127 formed over the dielectric material 126 and the electronic dies 122, in accordance with some embodiments. The bonding layer 127 may be an adhesive layer or may be a dielectric layer used for dielectric-to-dielectric bonding of the support 128, for example. A dielectric bonding layer 127 may be a dielectric material suitable for bonding, which may be a material similar to those described previously for the dielectric layer 108 or a dielectric layer 117, in some cases. The bonding layer 127 may be deposited using similar techniques as the dielectric layer 108 or a dielectric layer 117. Other materials or deposition techniques are possible. In some embodiments, a planarization process is performed on the bonding layer 127. In other embodiments, a bonding layer 127 is not formed.

Turning to FIG. 11, the support 128 is bonded to the bonding layer 127. The support 128 may comprise one or more materials such as silicon (e.g., a silicon wafer, bulk silicon, or the like), a silicon oxide, a metal, an organic core material, the like, or another type of material. In some embodiments, the support 128 may have a thickness between about between about 500 μm and about 700 μm. The support 128 may also have lateral dimensions (e.g., length, width, and/or area) that are greater than, about the same as, or smaller than those of the structure. In the example of FIG. 10, an optional micro lens 131 is formed in the upper surface of the support 128. The micro lens 131 may facilitate improved optical coupling between a grating coupler 107 and a vertically-mounted optical fiber (e.g., optical fiber 170 in FIG. 23). In some embodiments, the micro lens 131 is formed in the support 128 using an etching process, such as a dry etching process or a wet etching process. In some embodiments, an index-matching material or the like (not shown) is deposited over the micro lens 131.

In some embodiments, the support 128 includes a bonding layer 129, which may be an adhesive layer or a layer suitable for direct bonding to the bonding layer 127. For example, the bonding layer 129 may be a dielectric material suitable for dielectric-to-dielectric bonding, which may be similar to the bonding layer 127. The bonding layer 129 may be bonded to the bonding layer 127 using, for example, a dielectric-to-dielectric bonding process such as that described previously for bonding the electronic die 122 to the redistribution structure 120. In other embodiments, the support 128 is attached at a later process step during the manufacturing the photonic package 100 than shown.

Figure 12:
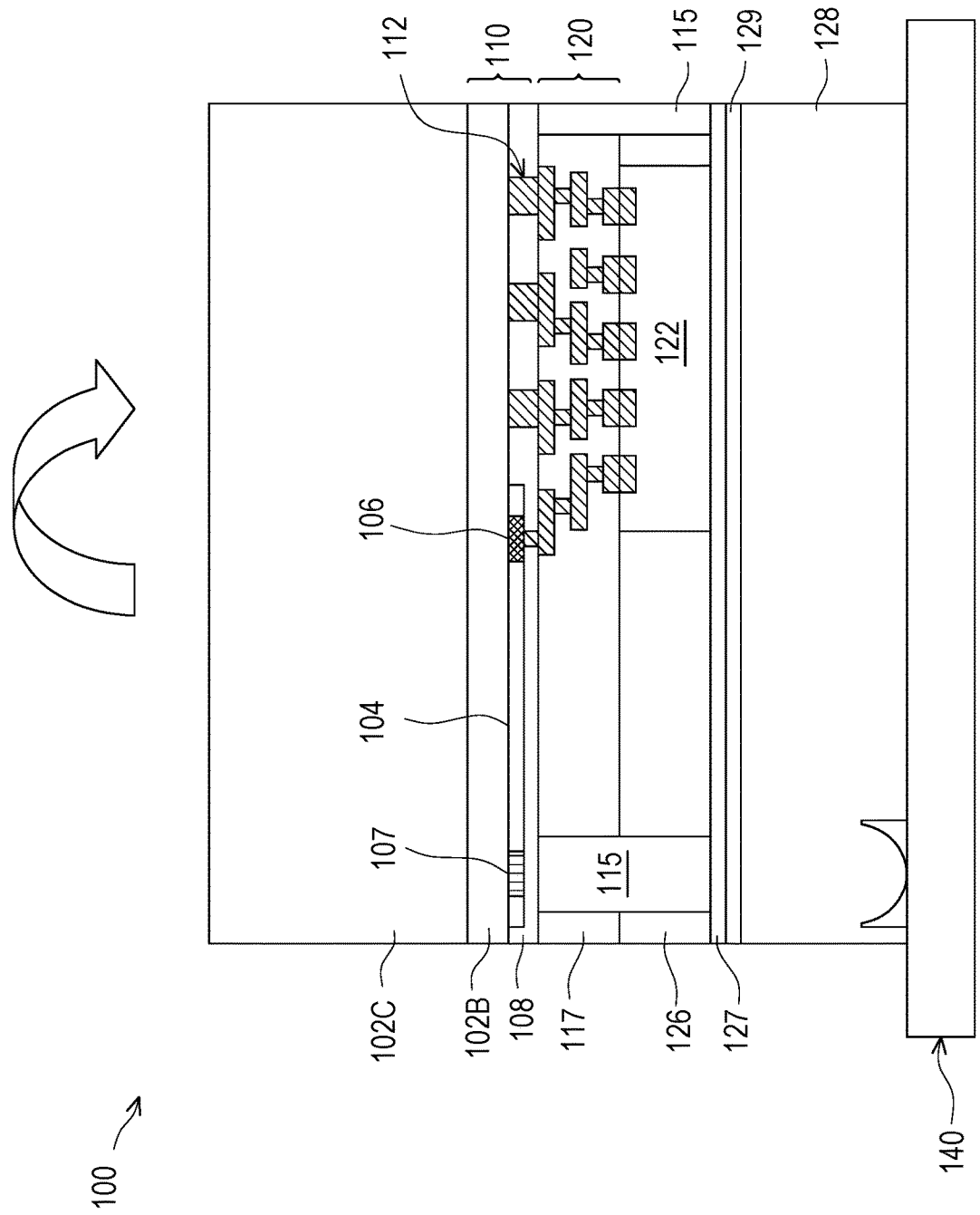

In FIG. 12, the structure in FIG. 11 is flipped over and attached to a carrier 140, in accordance with some embodiments. The carrier 140 may be, for example, a wafer (e.g., a silicon wafer), a panel, a glass substrate, a ceramic substrate, or the like. The structure may be attached to the carrier 140 using, for example, an adhesive or a release layer (not shown). Although one photonic package 100 is shown in FIG. 12, skilled artisan will appreciate that tens, hundreds, or more identical photonic packages may be formed over the carrier 140 at the same. In some embodiments, a singulation process is performed to separate the multiple photonic packages into individual photonic packages 100.

Figure 13:
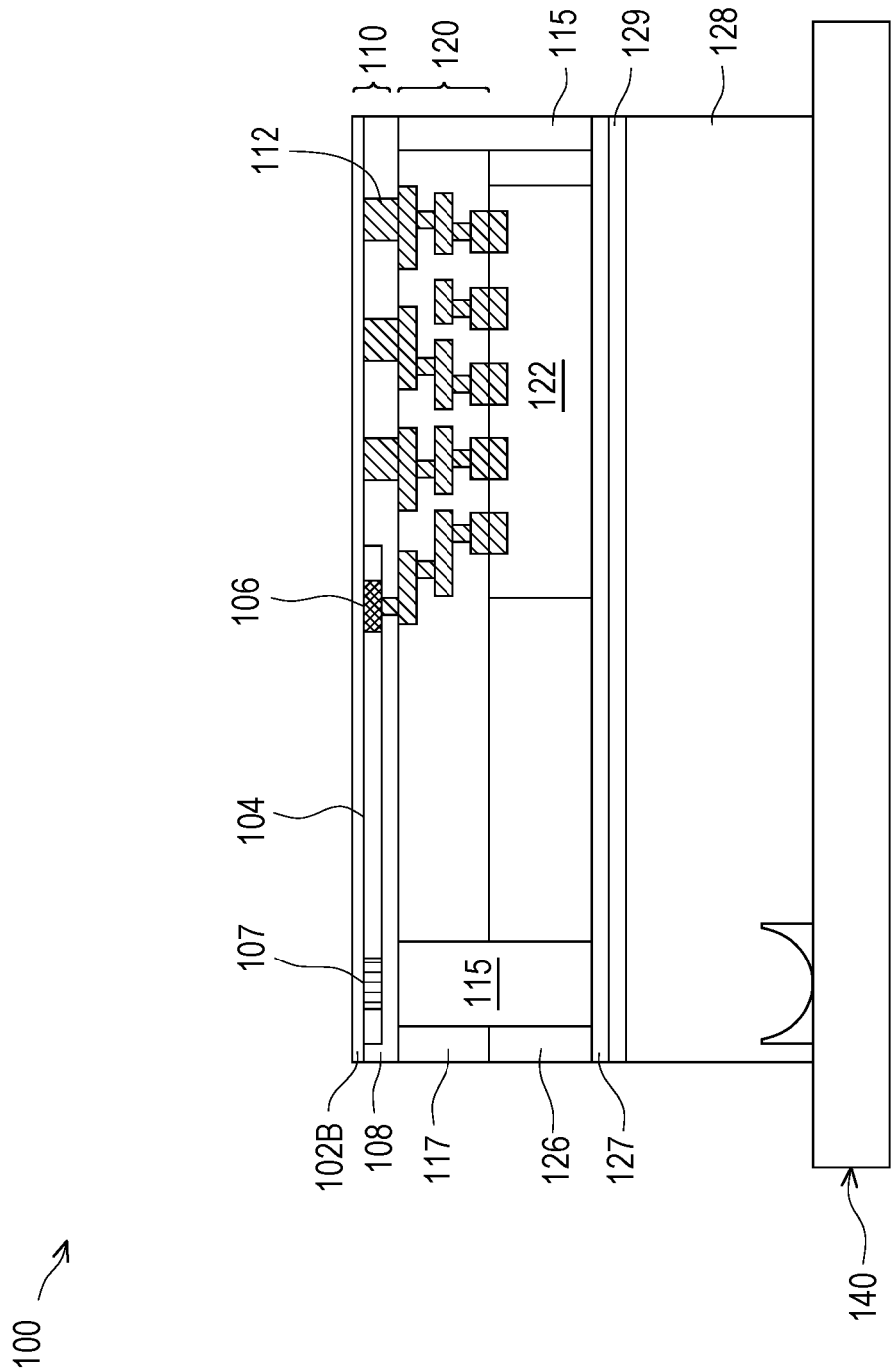

In FIG. 13, the substrate 102C is removed, in accordance with some embodiments. The substrate 102C may be removed using a planarization process (e.g., a CMP or grinding process), an etching process, a combination thereof, or the like. In some embodiments, the oxide layer 102B is also thinned. The oxide layer 102B may be thinned as part of the removal process for the substrate 102C, or the oxide layer 102B may be thinned in a separate step. The oxide layer 102B may be thinned, for example, using a planarization process, an etching process, a combination thereof, or the like. In some embodiments, after thinning, the oxide layer 102B may have a thickness in the range of about 0.1 μm to about 1.0 μm. Other thicknesses are possible. In some cases, thinning the oxide layer 102B may improve optical coupling between a waveguide 104 and a nitride waveguide 134 (see FIG. 14).

Figure 14:
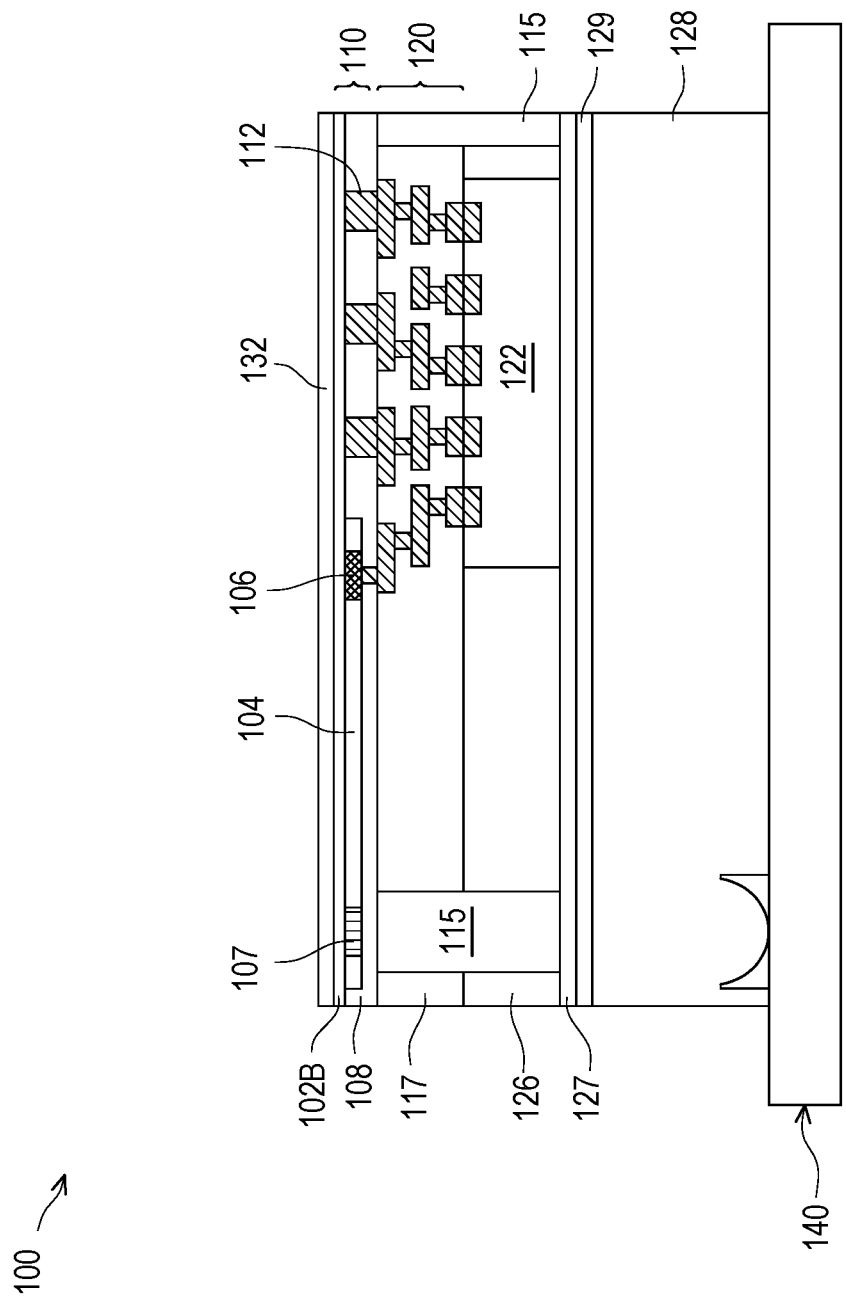
Figure 15:
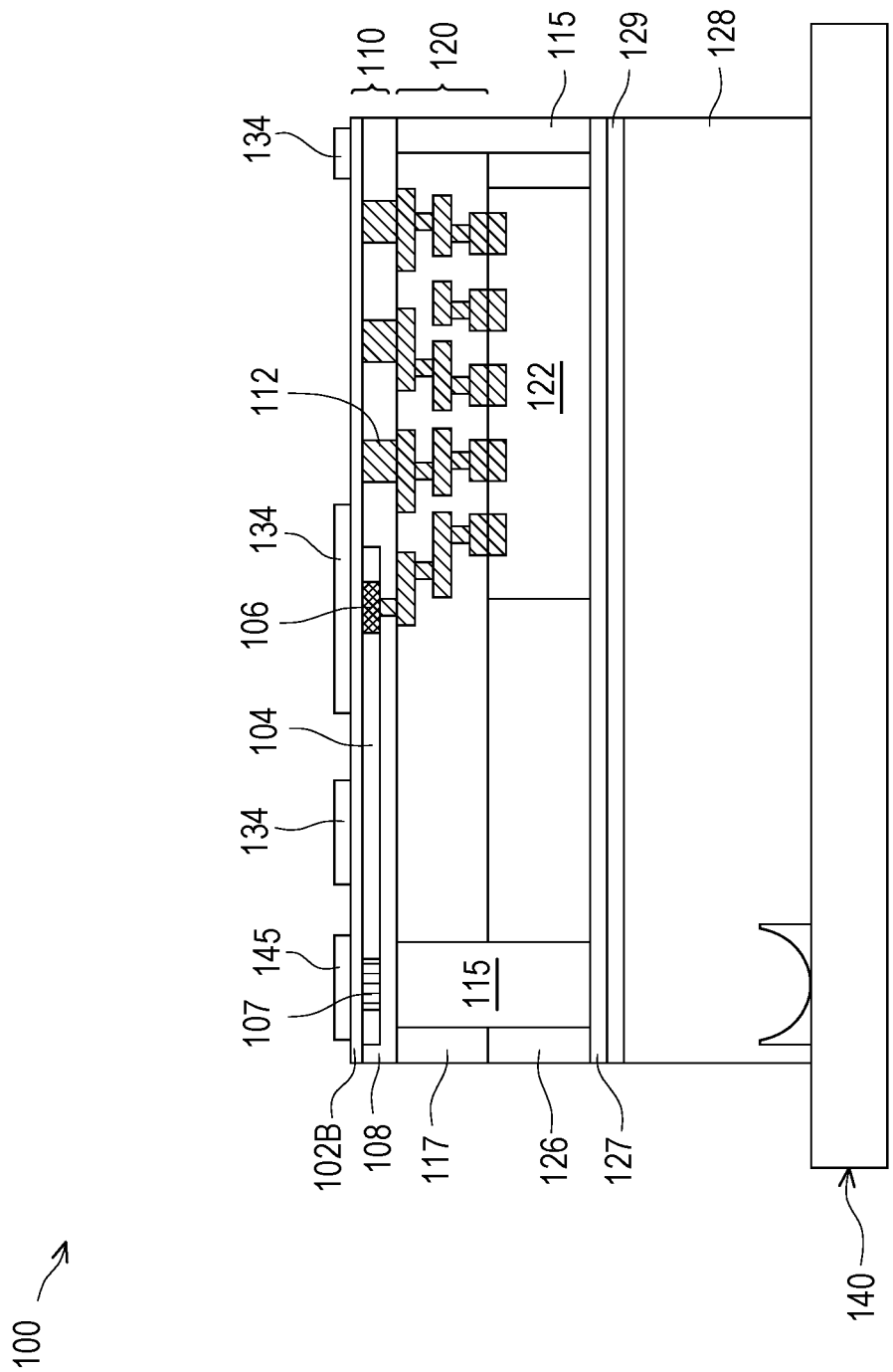

Turning to FIGS. 14 and 15, nitride waveguides 134 are formed over the oxide layer 102B, in accordance with some embodiments. In FIG. 14, a silicon nitride layer 132 is deposited on the oxide layer 102B. The silicon nitride layer 132 may be formed using a suitable deposition technique, such as CVD, PECVD, LPCVD, PVD, or the like. In some embodiments, the silicon nitride layer 132 is formed having a thickness in the range of about 0.2 µm to about 1.0 µm, though other thicknesses are possible. FIGS. 14-15 illustrate the formation of one set of nitride waveguides 134, but in other embodiments, additional sets of overlying nitride waveguides 134 may be formed. An example such embodiment is described below for FIG. 26.

In FIG. 15, the silicon nitride layer 132 is patterned to form the nitride waveguides 134, in accordance with some embodiments. The nitride waveguide 134 may be patterned using acceptable photolithography and etching techniques. For example, a hardmask layer (not shown) may be formed over the silicon nitride layer 132 and patterned, in some embodiments. The pattern of the hardmask layer may then be transferred to the silicon nitride layer 132 using an etching process. The etching process may include, for example, a dry etching process and/or a wet etching process. In some embodiments, the etching process may be selective to silicon nitride over silicon oxide or other materials. In this manner, the silicon nitride layer 132 may be etched to form recesses defining the nitride waveguides 134, with sidewalls of the remaining unrecessed portions defining sidewalls of the nitride waveguides 134. In some embodiments, more than one photolithography and etching sequence may be used in order to pattern the silicon nitride layer 132. One nitride waveguide 134 or multiple nitride waveguides 134 may be patterned from the silicon nitride layer 132. If multiple nitride waveguides 134 are formed, the multiple nitride waveguides 134 may be individual separate nitride waveguides 134 or connected as a single continuous structure. In some embodiments, one or more of the nitride waveguides 134 form a continuous loop. In some embodiments, nitride waveguides 134 may include photonic structures such as grating couplers, edge couplers, or couplers (e.g., mode converters) that allow optical signals to be transmitted between two nitride waveguides 134 and/or between a nitride waveguide 134 and a waveguide 104.

In some cases, a waveguide formed from silicon nitride (e.g., nitride waveguides 134) may have advantages over a waveguide formed from silicon (e.g., waveguides 104). For example, silicon nitride has a higher dielectric constant than silicon, and thus a nitride waveguide may have a greater internal confinement of light than a silicon waveguide. This may also allow the performance or leakage of nitride waveguides to be less sensitive to process variations, less sensitive to dimensional uniformity, and less sensitive to surface roughness (e.g., edge roughness or linewidth roughness). In some cases, the reduced process sensitivity may allow nitride waveguides to be easier or less costly to process than silicon waveguides. These characteristics may allow a nitride waveguide to have a lower propagation loss than a silicon waveguide. In some cases, the propagation loss (dB/cm) of a nitride waveguide may be between about 0.1% and about 50% of a silicon waveguide. In some cases, a nitride waveguide may also be less sensitive to the temperature of the environment than a silicon waveguide. For example, a nitride waveguide may have a sensitivity to temperature that is as small as about 1% of that of a silicon waveguide. In this manner, the embodiments described herein can allow for the formation of a photonic package that has both nitride waveguides (e.g., nitride waveguides 134) and silicon waveguides (e.g., waveguides 104).

Still referring to FIG. 15, an optional reflector 145 may be formed on the oxide layer 102B over the grating coupler 107, in accordance with some embodiments. The reflector 145 can allow for more efficient coupling between a grating coupler 107 and a vertically-mounted optical fiber (e.g., optical fiber 170 in FIG. 23). The reflector 145 may be formed from one or more dielectric materials, metal materials, or the like, which may be deposited using suitable deposition processes. After depositing the material of the reflector 145, the reflector 145 may be formed using suitable techniques, such as using photolithographic patterning and etching techniques. Other techniques of forming a reflector 145 are possible.

Figure 16:
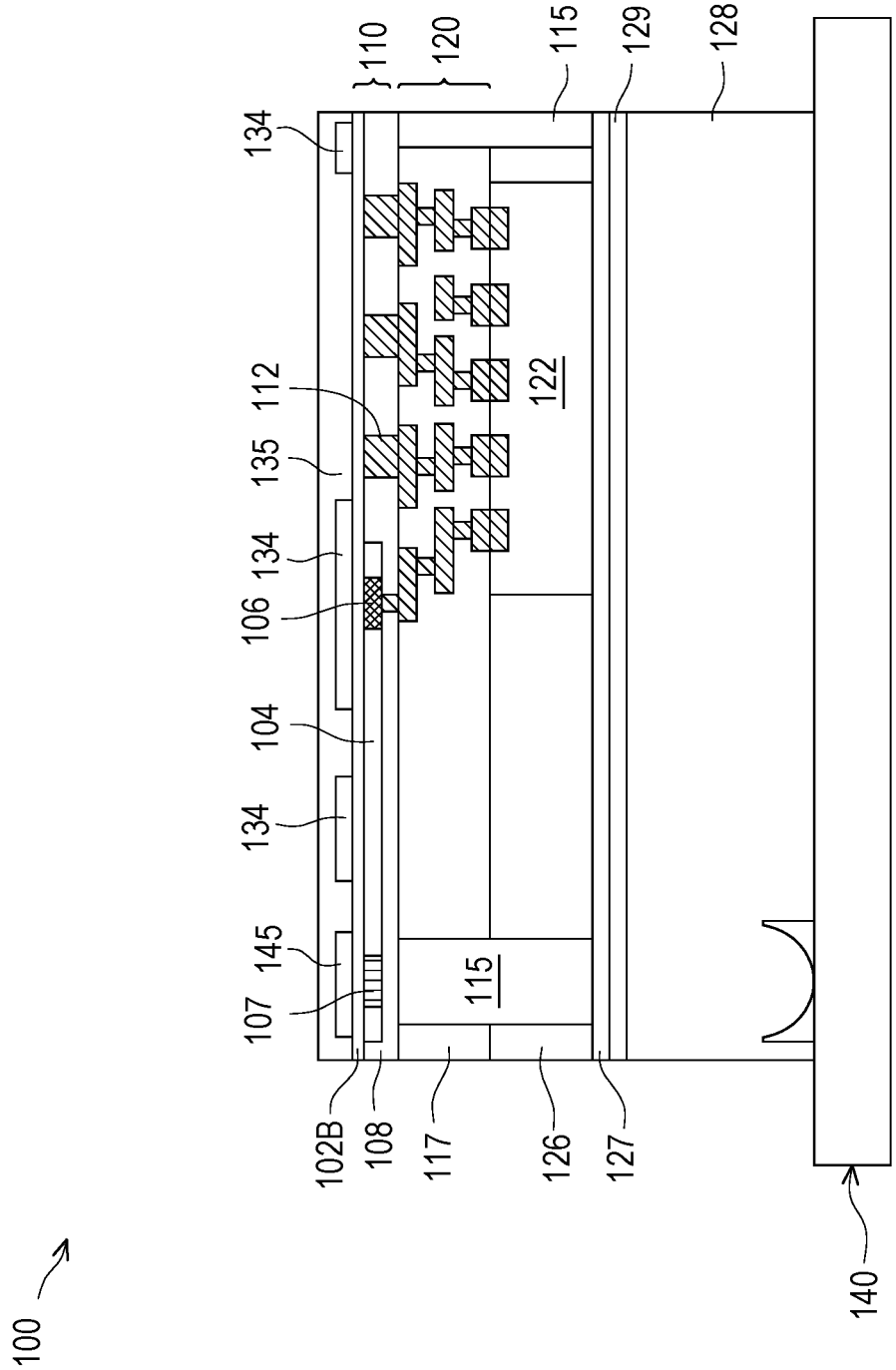

Turning to FIG. 16, a dielectric layer 135 is formed over the nitride waveguides 134, the reflector 145, and the oxide layer 102B, in accordance with some embodiments. The dielectric layer 135 may comprise one or more materials similar to those described above for the dielectric layer 108 or the dielectric layer 115. For example, the dielectric layer 135 may comprise a silicon oxide, spin-on glass, or the like. The dielectric layer 135 may be formed using a technique similar to those described above for the dielectric layer 108 or the dielectric layer 115, or may be formed using a different technique. For example, the dielectric layer 135 may be formed using CVD, PVD, spin-on, or the like, though another technique may be used. In some embodiments, a planarization process (e.g., a CMP or grinding process) is used to remove excess material of the dielectric layer 135. After planarization, the dielectric layer 135 may have a thickness between about 0.5 µm and about 2 µm, in some embodiments. Other thicknesses are possible. In some cases, a thinner dielectric layer 135 may allow for more efficient optical coupling between the nitride waveguides 134 and an overlying laser diode 162 (see FIG. 19).

Figure 17:
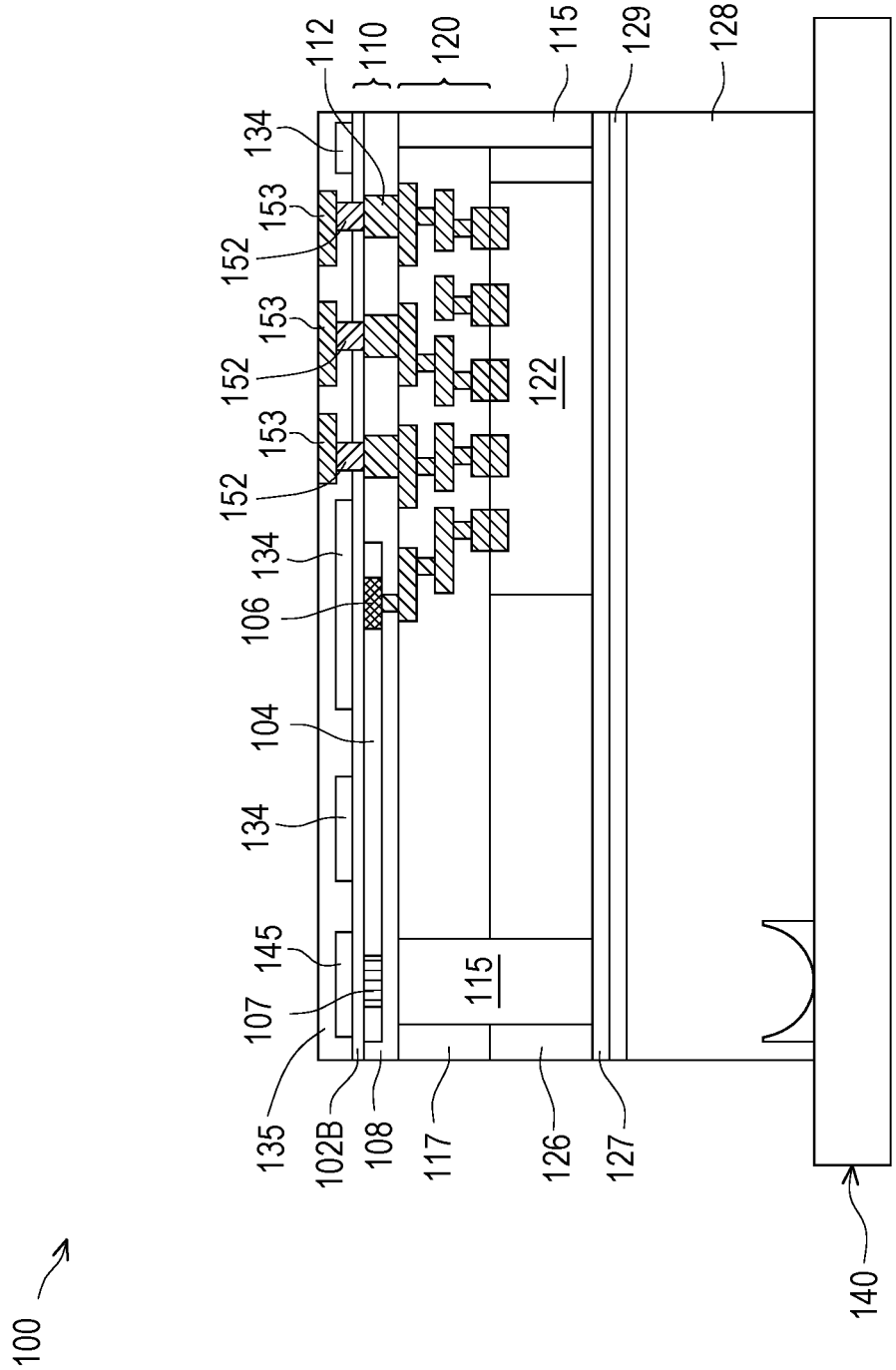

In FIG. 17, vias 152 and conductive pads 153 are formed, in accordance with some embodiments. The vias 152 extend through the dielectric layer 135 and the oxide layer 102B physically and electrically connect to the vias 112. In some embodiments, conductive pads 153 are formed in the dielectric layer 135 over respective vias 152. The vias 152 and the conductive pads 153 may be formed by the same or similar formation methods as the vias 112 and the conductive pads 116, in some cases. In some embodiments, the conductive pads 153 include conductive lines (e.g., a metallization pattern) that provides electrical routing.

Figure 18:
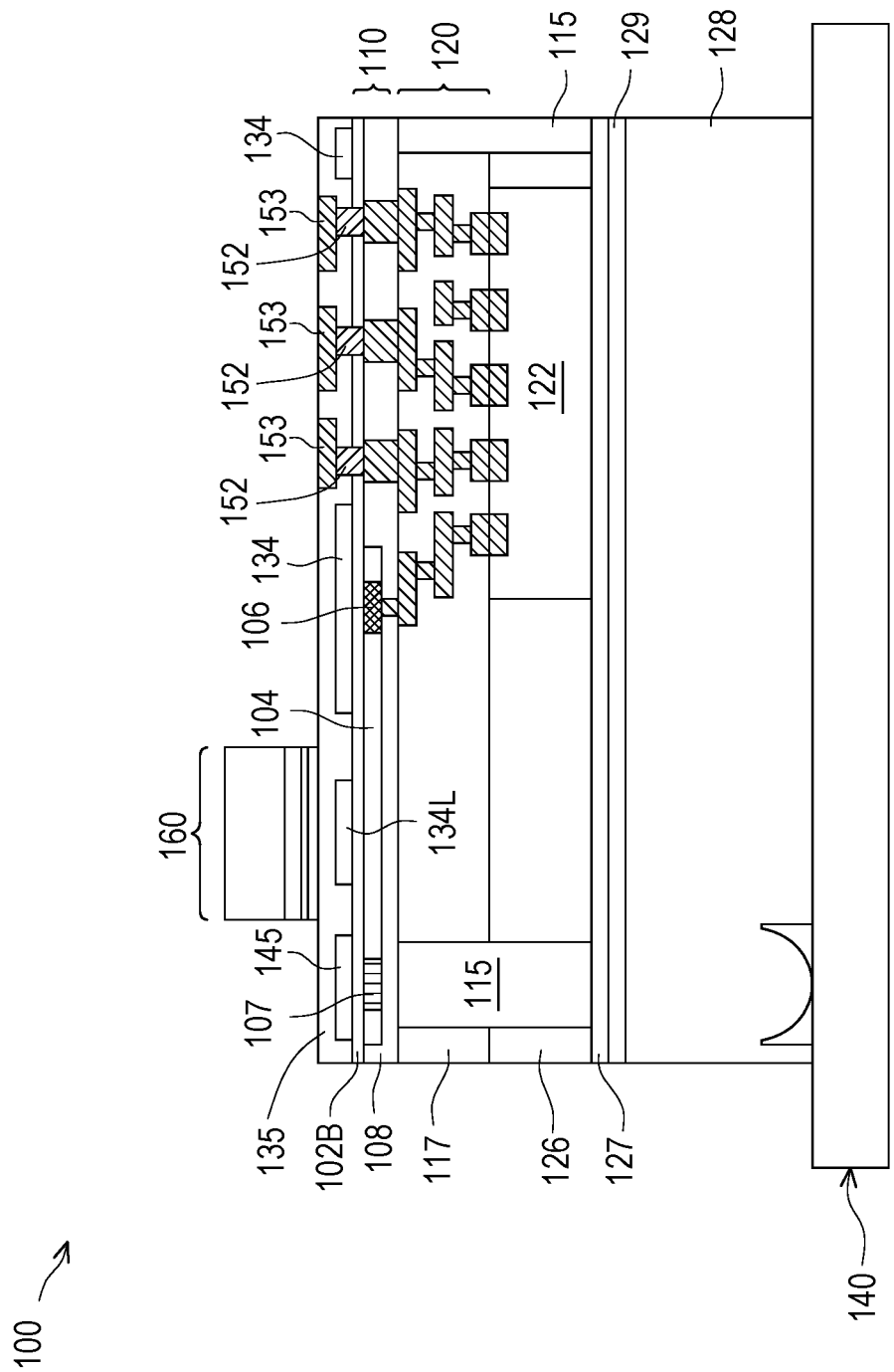
Figure 19:
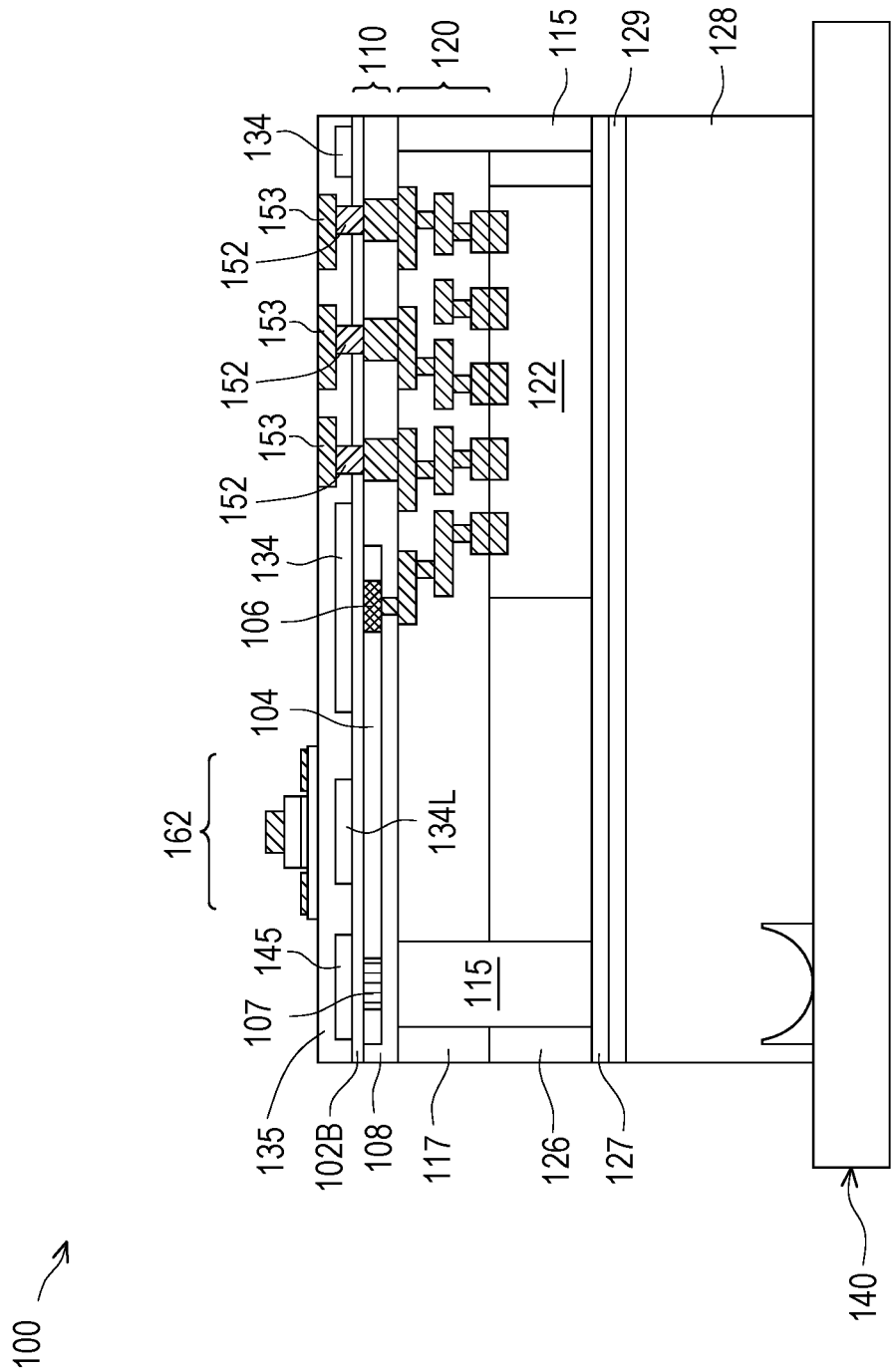

FIGS. 18 and 19 illustrate the formation of a laser diode 162 on the dielectric layer 135, in accordance with some embodiments. The laser diode 162 may be a source of light that provides optical power for the photonic package 100. In some embodiments, the light emitted by the laser diode 162 is coupled into the nitride waveguides 134. For example, as illustrated in FIG. 19, the light emitted by the laser diode 162 may be coupled through the dielectric layer 135 into an underlying portion of the nitride waveguides 134 that is indicated as nitride waveguide 134L. More than one laser diode 162 may be formed, and in other embodiments a light-emitting diode (LED) or other type of light source may be formed on the dielectric layer 135 instead of or in addition to the laser diode 162. The techniques described herein enable the heterogeneous integration of laser diodes into a photonic package. For example, the laser diode 162 may comprise a III-V device, though other types of heterogeneous devices are possible.

Turning to FIG. 18, a laser substrate 160 is bonded to the dielectric layer 135, in accordance with some embodiments. The laser substrate 160 is bonded to the side of the structure corresponding to the back-side of the substrate 102. The laser substrate 160 may be a die, chip, singulated substrate, or the like in which at least some of the materials or layers of the laser diode 162 have been formed. For example, in some embodiments, layers corresponding to active layers, source and/or drain layers, distributed Bragg reflector (DBR) layers, or other layers of the laser diode 162 may be formed in the laser substrate 160. In some embodiments, the laser substrate 160 comprises, for example, a semiconductor material such as doped or undoped silicon; germanium; a compound semiconductor including silicon carbide, gallium arsenic, gallium phosphide, indium phosphide, indium arsenide, and/or indium antimonide; an alloy semiconductor including silicon germanium, GaAsP, AlInAs, AlGaAs, GaInAs, GaInP, and/or GaInAsP; the like; or combinations thereof. The laser substrate 160 may also include various dielectric layers, oxide layers, metallization layers, or the like. In some embodiments, the laser substrate 160 includes a bonding layer (not separately labeled), which may be an outer dielectric layer that is directly bonded to the dielectric layer 135. The bonding layer may comprise, for example, an oxide material or another material suitable for dielectric-to-dielectric bonding. Other layers or materials are possible. The laser substrate 160 may have a smaller width or smaller area than the photonic package 100.

In some embodiments, the laser substrate 160 may be bonded to the dielectric layer 135 using a direct bonding process such as a chip-to-wafer bonding process, a dielectric-to-dielectric bonding process, or the like. The direct bonding process may be similar to those described previously (e.g., for bonding the redistribution structure 120 and the electronic die 122). For example, a surface treatment or activation process may first be performed on the dielectric layer 135 and/or the bonding layer of the laser substrate 160. The laser substrate 160 is then aligned with the nitride waveguides 134 (e.g., with the nitride waveguide 134L) and placed into physical contact with the dielectric layer 135. The laser substrate 160 may be placed on the dielectric layer 135 using a pick-and-place process, for example. In some embodiments, after placing the laser substrate 160, a process such as a thermal process or pressing process may be performed. In some cases, by directly bonding the laser substrate 160 to the dielectric layer 135, the laser diode 162 may be formed closer to the nitride waveguides 134 and thus have improved optical coupling to the nitride waveguides 134.

In FIG. 19, the laser substrate 160 is processed to form the laser diode 162, in accordance with some embodiments. The processing may include suitable processing steps performed in a suitable order, such as implantation steps, patterning steps, etching steps, deposition steps, other types of processing steps, the like, or combinations thereof. As shown in FIG. 19, portions of the laser substrate 160 may be etched using, for example, a suitable photolithography and etching process. In some embodiments, etching the laser substrate 160 after bonding can allow improved alignment or improved optical coupling to the nitride waveguides 134. In some embodiments, an implantation process may be performed to introduce dopants within the semiconductor material of the laser substrate 160. For example, regions of the laser substrate 160 may be doped with p-type dopants, n-type dopants, or a combination. In some embodiments, conductive contacts to appropriate features of the the laser diode 162 may be formed. Other processing steps are possible, and the particulars of the processing steps may depend on the specific structure of the laser substrate 160 or the laser diode 162. In other embodiments, the laser diode 162 is formed in advance and attached to the dielectric layer 135, and fewer additional processing steps are performed after bonding. In some cases, by performing processing steps to form the laser diode 162 after the laser substrate 160 has been bonded to the dielectric layer 135, the laser diode 162 may have improved alignment or optical coupling to the nitride waveguides 134. In some cases, bonding an individual laser substrate 160 having a smaller area than the photonic package 100 (e.g., a chip, a die, or the like) can allow for cheaper manufacturing cost, improved yield, and improved optical coupling.

Figure 20:
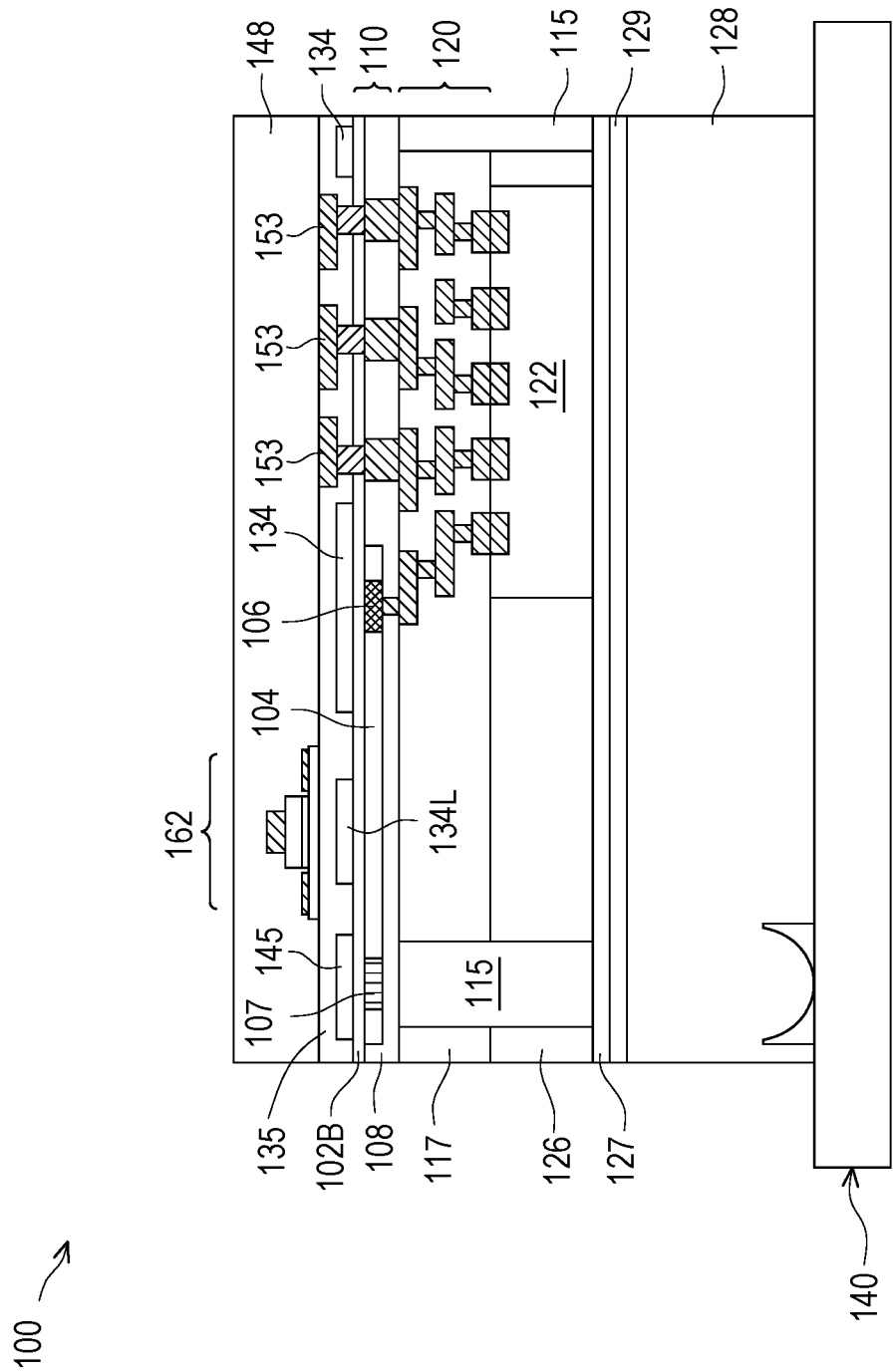

In FIG. 20, a dielectric layer 148 is formed over the laser diode 162 and the dielectric layer 135, in accordance with some embodiments. The dielectric layer 148 may be similar to previously formed dielectric layers such as dielectric layers 108, 115, 135, or the like, and may be formed using a similar technique. In some embodiments, a planarization process such as a CMP process is performed after depositing the dielectric layer 148.

Figure 21:
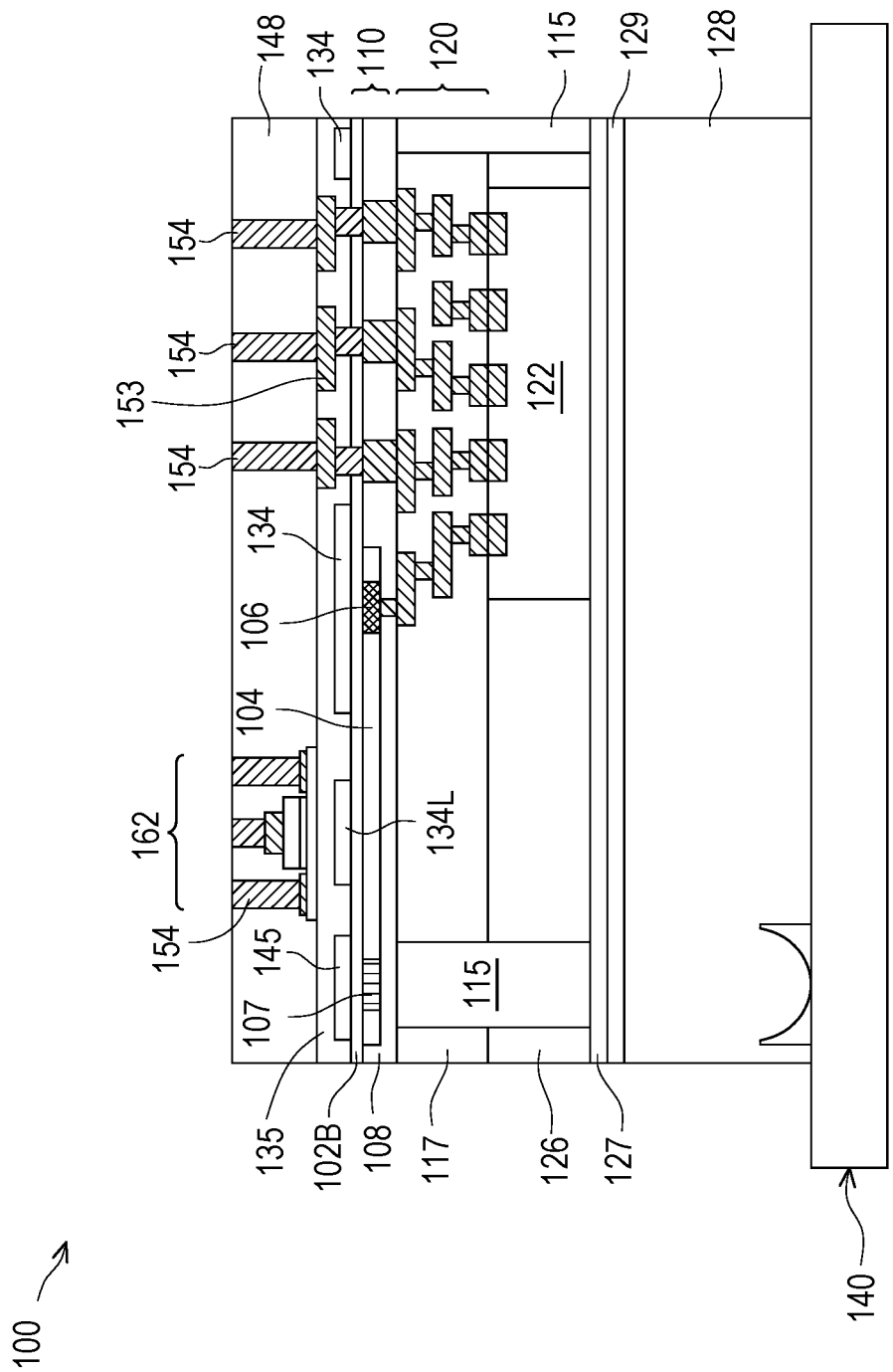

In FIG. 21, vias 154 are formed extending through the dielectric layer 148, in accordance with some embodiments. The vias 154 may extend through the dielectric layer 148 to physically and electrically contact the conductive pads 153 and/or the conductive contacts of the laser diode 162. The vias 154 may be formed by the same or similar formation methods as the vias 112 or the vias 152, in some cases.

Figure 22:
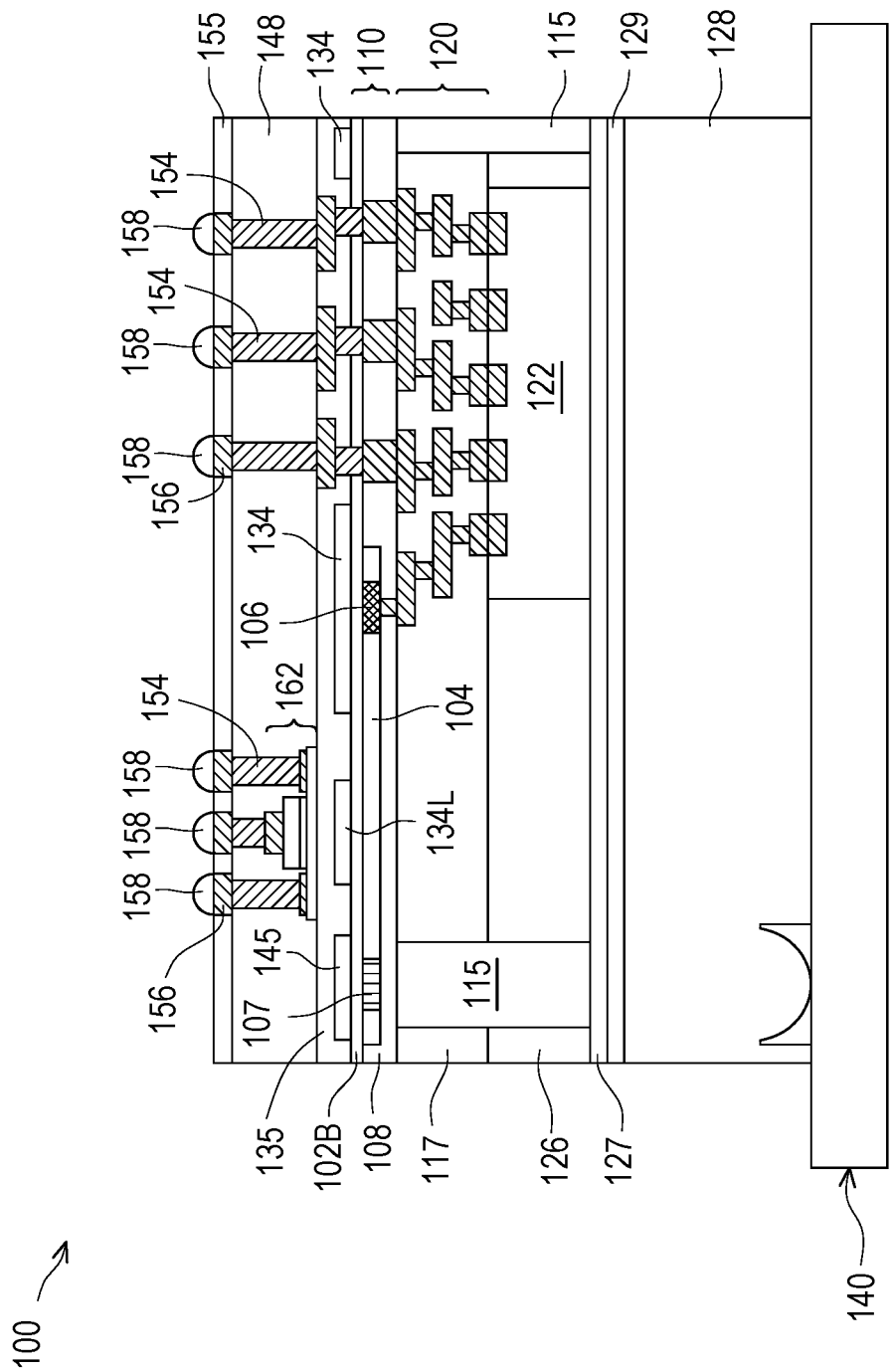

In FIG. 22, conductive connectors 158 are formed on the vias 154, in accordance with some embodiments. The conductive connectors 158 may be used to electrically connect the photonic package 100 to an external structure such as a package substrate, organic core substrate, interposer, or the like. In some embodiments, an optional passivation layer 155 is formed over the dielectric layer 148, in accordance with some embodiments. The passivation layer 155 may comprise, for example, a polymer such as PBO, polyimide, BCB, or the like; a nitride such as silicon nitride or the like; an oxide such as silicon oxide, PSG, BSG, BPSG, or the like; an encapsulant, molding compound, or the like; the like, or a combination thereof. The passivation layer 155 may be formed, for example, by spin coating, lamination, CVD, PVD, ALD, or the like.

Under-bump metallizations (UBMs) 156 may then be formed within the passivation layer 155 to make physical and electrical contact to the vias 154. In other embodiments, the UBMs 156 are formed prior to forming the passivation layer 155. In some embodiments, the UBMs 156 have bump portions on and extending along the major surface of the passivation layer 155. The UBMs 156 may be formed of one or more conductive materials using a suitable process, such as plating. In some embodiments, the UBMs 156 are not formed.

The conductive connectors 158 are then formed on the UBMs 156, in accordance with some embodiments. The conductive connectors 158 may be, for example, ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 158 may include a conductive material such as solder, copper, aluminum, gold, nickel, silver, palladium, tin, the like, or a combination thereof. In some embodiments, the conductive connectors 158 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 158 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In other embodiments, the conductive connectors 158 are omitted and the UBMs 156 are bonding pads used for metal-to-metal bonding to an external component.

Figure 23:
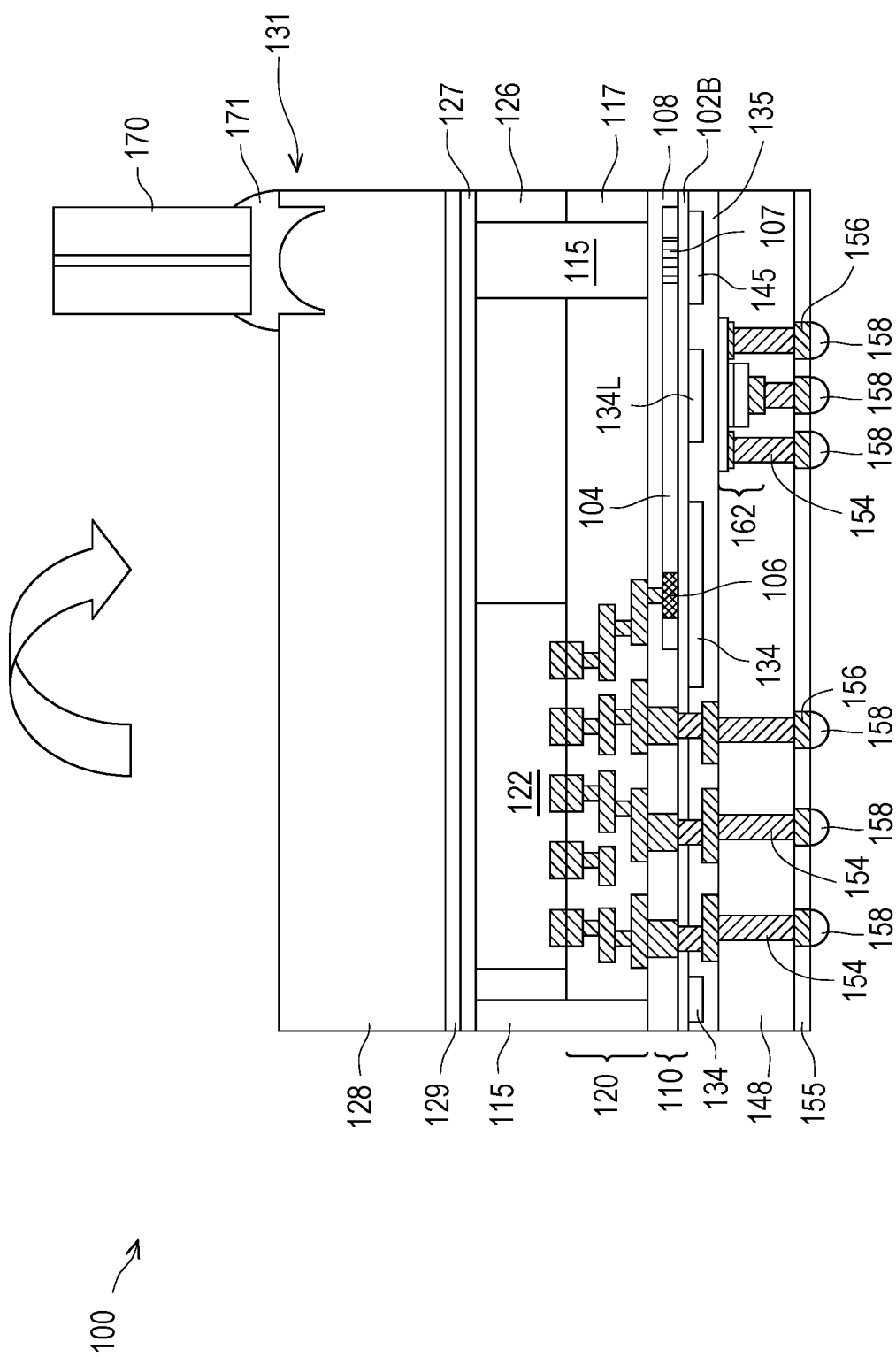

In FIG. 23, a de-bonding is performed to detach (or "de-bond") the carrier 140 from the structure, forming a photonic package 100, in accordance with some embodiments. For example, the de-bonding may include projecting a light such as a laser light or an UV light on a release layer (if present) so that the release layer decomposes under the heat of the light and the carrier 140 can be removed. In other embodiments, the carrier 140 may be removed using an etching process, a CMP process, a grinding process, the like, or a combination thereof. In some embodiments, multiple photonic packages 100 may be formed on a single substrate 102 and singulated to form individual photonic packages 100, such as the individual photonic package 100 shown in FIG. 23. The singulation may be performed, for example, before or after the debonding.

Still referring to FIG. 23, the photonic package 100 is shown as coupled to a vertically-mounted optical fiber 170, in accordance with some embodiments. In other embodiments, another number of vertically-mounted optical fibers are coupled to the photonic package 100. The optical fibers 170 may be mounted to the photonic package 100 using an optical glue 171 or the like.

In some embodiments, the vertically-mounted optical fiber 170 may be configured to optically couple to a grating coupler within the photonic package 100, such as the grating coupler 107. In this manner, the vertically-mounted optical fiber 170 may be mounted over the micro lens 131, in some embodiments. The vertically-mounted optical fiber 170 may be mounted at an angle with respect to the vertical axis or may be laterally offset from the grating coupler 107. In the embodiment shown in FIG. 23, the optical signals and/or optical power transmitted between the vertically-mounted optical fiber 170 and the grating coupler 107 are transmitted through the support 128, the bonding layer 129, the bonding layer 127, the dielectric layer 115 and the dielectric layer 108. Optical signals may be transmitted from the optical fiber 170 to the grating coupler 107 and into one or more nitride waveguides 134, wherein the optical signals may be coupled into one or more other nitride waveguides 134 and/or into one or more waveguides 104. The optical signals may be detected by a photonic component 106 comprising a photodetector and transmitted as electrical signals into the electronic die 122. Optical signals generated within the waveguides 104 by a photonic component 106 comprising a modulator may be transmitted from the waveguides 104 to the nitride waveguides 134, from the nitride waveguides 134 to the grating coupler 107, and from the grating coupler 107 to the vertically-mounted optical fiber 170. Mounting the optical fiber 170 in a vertical orientation may allow for improved optical coupling, reduced processing cost, or greater design flexibility of the photonic package 100.

Figure 24:
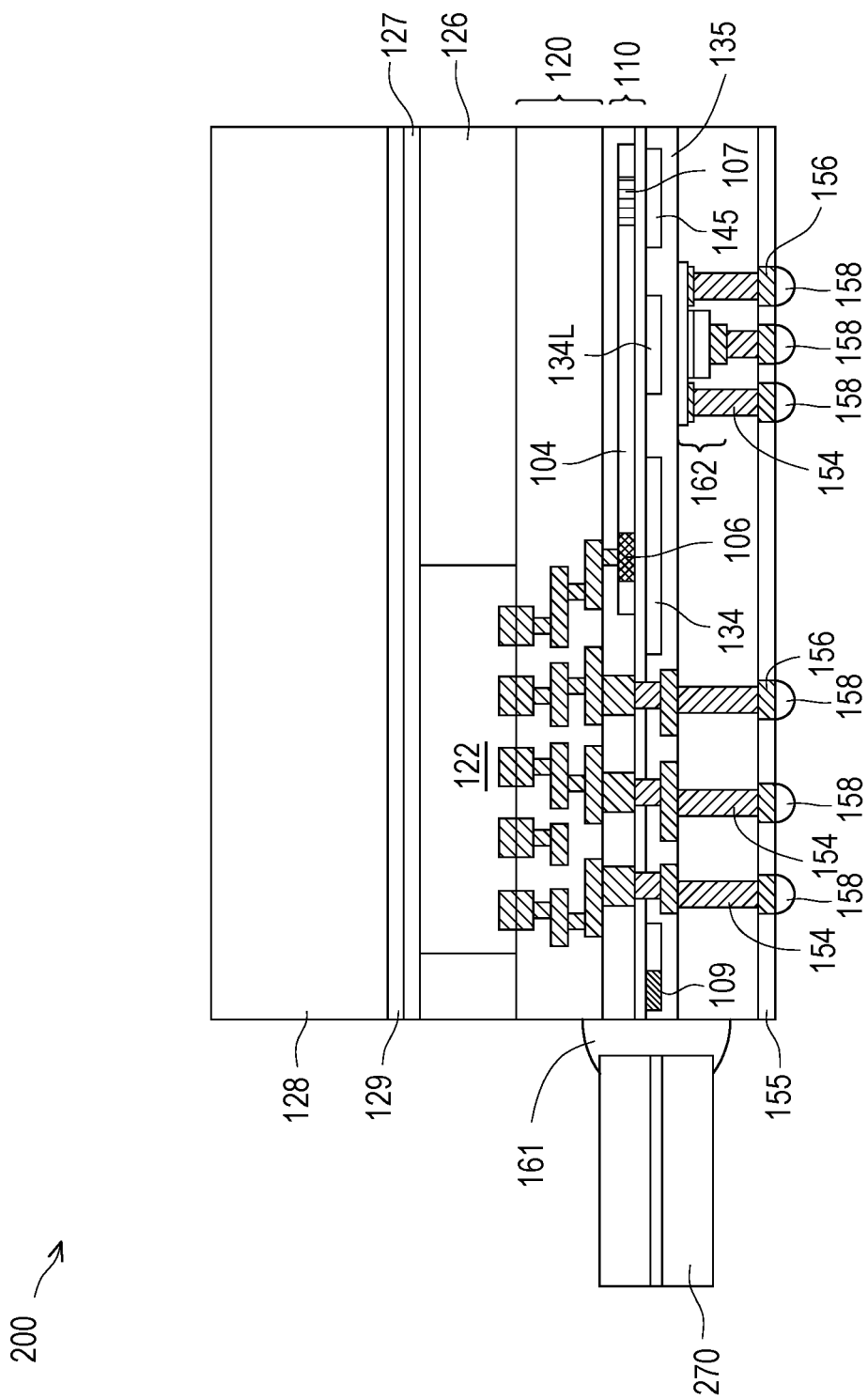
FIG. 24 illustrates a cross-sectional view of a photonic package, in accordance with another embodiment.

FIG. 24 illustrates a photonic package 200, in accordance with some embodiments. The photonic package 200 is similar to the photonic package 100 shown in FIG. 24, except that a horizontally-mounted optical fiber 270 is mounted to the photonic package 200 rather than a vertically mounted optical fiber 170. In other embodiments, another number of horizontally-mounted optical fibers are coupled to the photonic package 200. The optical fibers 260 may be mounted to the photonic package 200 using an optical glue 171 or the like. In some embodiments, an edge coupler 109 may be formed as part of the nitride waveguides 134. For example, the edge coupler 109 may be formed by patterning the silicon nitride layer 132. The horizontally-mounted optical fiber 270 may be mounted on a sidewall of the photonic package 200 near the edge coupler 109 such that optical signals are coupled between the horizontally-mounted optical fiber 270 and the nitride waveguides 134 by the edge coupler 109. In other embodiments, a silicon edge coupler may be formed as part of the waveguides 104, and the horizontally-mounted optical fiber 270 may be mounted near the silicon edge coupler such that optical signals are coupled from the horizontally-mounted optical fiber 270 into the waveguides 104 by the silicon edge coupler. A photonic package 200 may not include a grating coupler 107, in some embodiments. In other embodiments, a photonic package may include both a horizontally-mounted optical fiber 270 coupled by an edge coupler 109 and a vertically-mounted optical fiber 170 coupled by a grating coupler 107.

Figure 25:
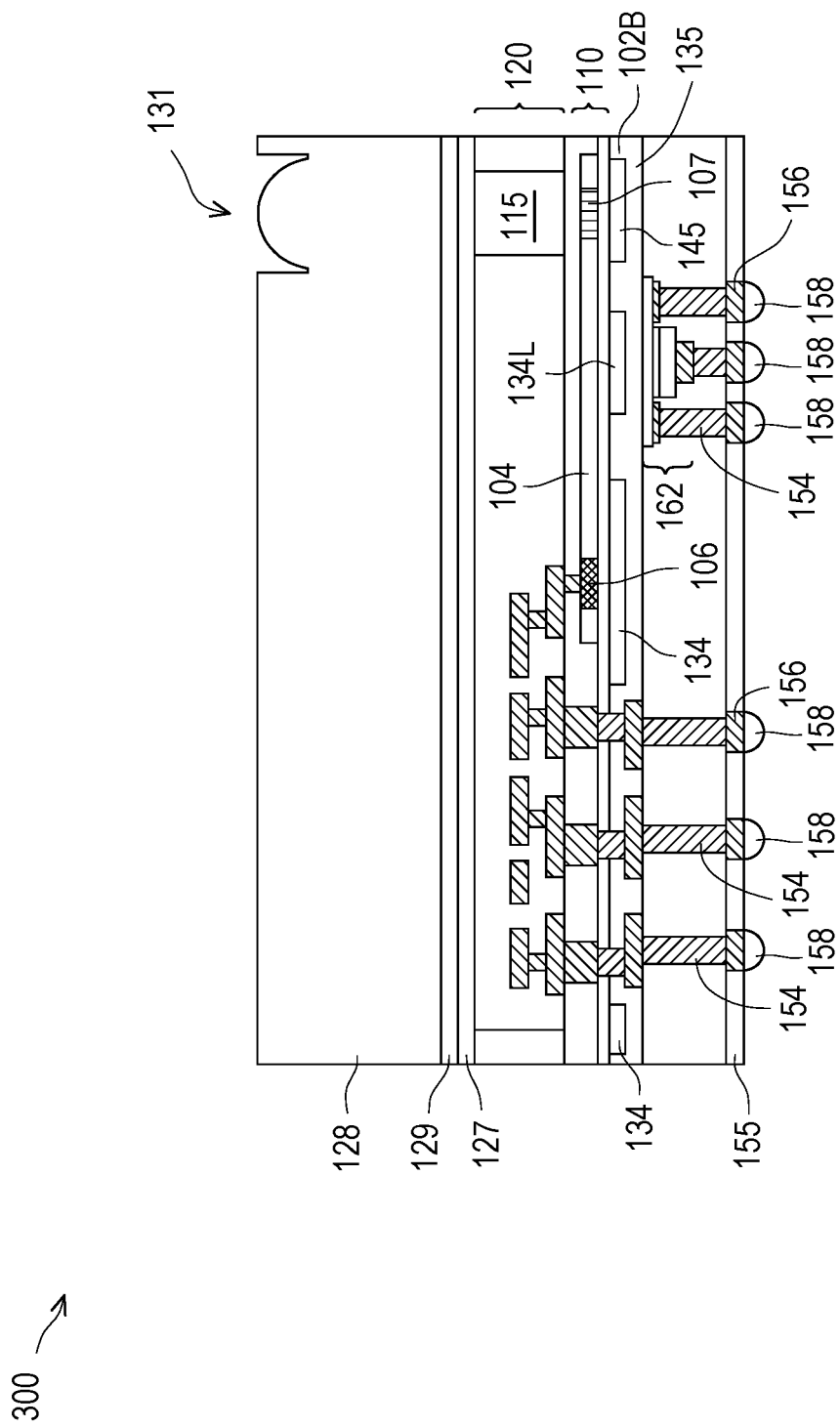
FIG. 25 illustrates a cross-sectional view of a photonic package, in accordance with another embodiment.

FIG. 25 illustrates a photonic package 300, in accordance with some embodiments. The photonic package 300 is similar to the photonic package 100 shown in FIG. 23, except that electronic dies 122 are not bonded to the redistribution structure 120. In some cases, the photonic package 300 may be connected to one or more electronic dies by the conductive connectors 158 or through a package substrate or the like (not shown).

Figure 26:
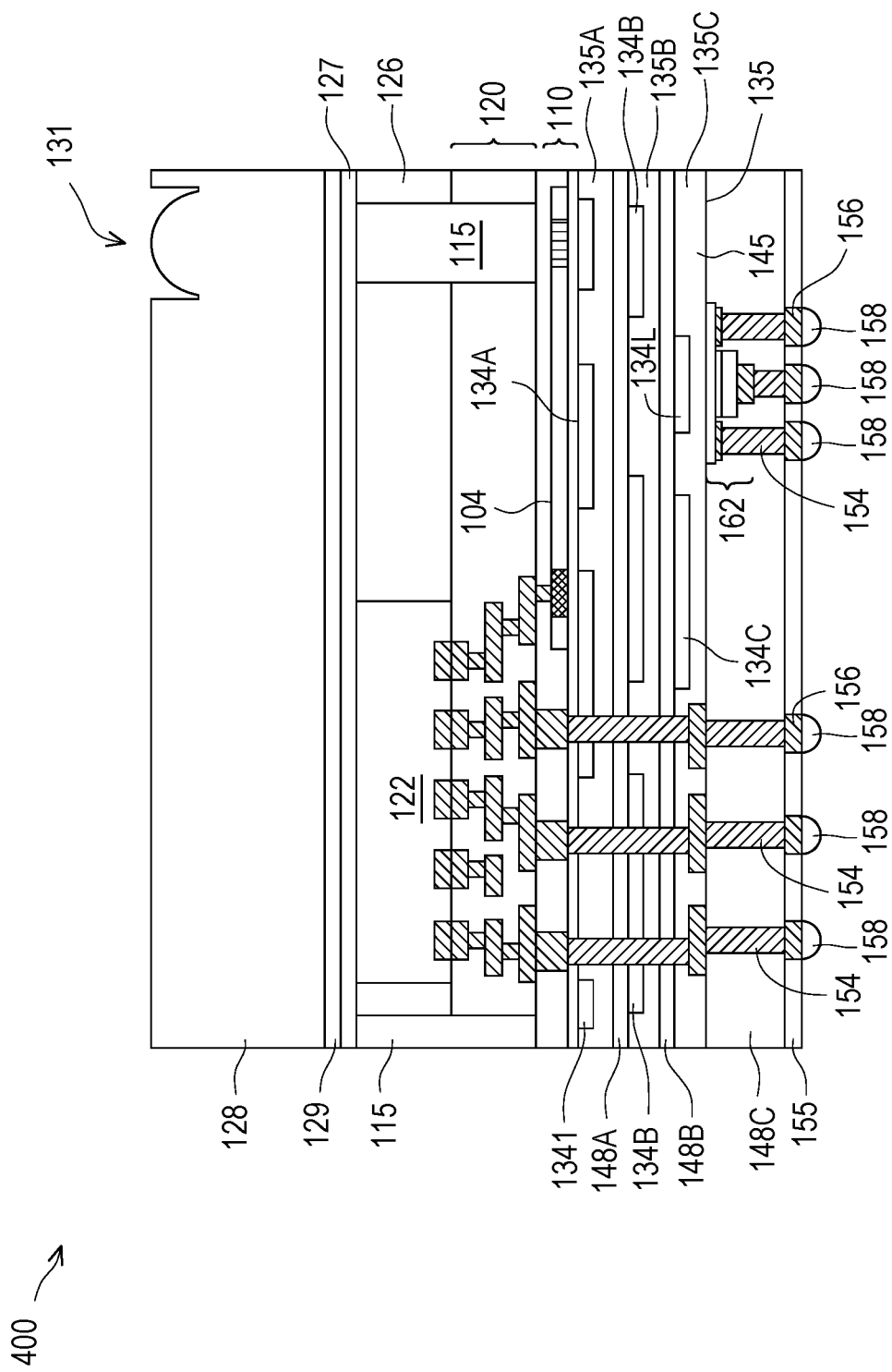
FIG. 26 illustrates a cross-sectional view of a photonic package, in accordance with another embodiment.

FIG. 26 illustrates a photonic package 400, in accordance with some embodiments. The photonic package 400 is similar to the photonic package 100 shown in FIG. 23, except that multiple sets of nitride waveguides 134A-C are formed over the waveguides 104. The use of multiple sets of nitride waveguides can allow for additional optical signal routing, flexibility, or functionality within a photonic package. As shown in FIG. 26, the set of nitride waveguides 134A is formed over the waveguides 104, similar to the waveguides 134 of the photonic package 100. The set of nitride waveguides 134B is formed over the nitride waveguides 134A, and the set of nitride waveguides 134B is optically coupled to the nitride waveguides 134A. The set of nitride waveguides 134C is formed over the nitride waveguides 134B, and the set of nitride waveguides 134C is optically coupled to the nitride waveguides 134B. The photonic package 400 of FIG. 26 includes three sets of nitride waveguides 134A, 134B, and 134C, but a photonic package may have another number of sets of nitride waveguides, such as two sets or four or more sets. Each set of nitride waveguides 134A-C may be formed using techniques similar to those described previously for forming the nitride waveguides 134 of the photonic package 100. For example, a silicon nitride layer may be deposited and patterned to form a set of nitride waveguides (e.g., nitride waveguides 134A, 134B, or 134C), a dielectric layer may be deposited over the set of nitride waveguides (e.g., dielectric layer 135A, 135B or 135C). Additional dielectric layers 148A, 148B, and 148C may be deposited over dielectric layers 135A, 135B, and 135C, respectively. In other embodiments, the dielectric layers 148A and 148B may be omitted. Vias 152 may be formed extending through the various dielectric layers (e.g., dielectric layers 135A-C and 148A-B) to contact the vias 112. A laser diode 162 may be formed by bonding a laser substrate 160 to the dielectric layer covering the topmost set of nitride waveguides (e.g., the dielectric layer 135C covering the nitride waveguides 134C), and then processing the laser substrate 160. Other features such as conductive pads 153, vias 154, UBMs 156, and conductive connectors 158 may be formed using techniques similar to those described previously for the photonic package 100.

Horizontally-mounted optical fibers and/or vertically-mounted optical fibers may be coupled to the photonic package 400.

Embodiments may achieve advantages. For example, the use of both silicon and silicon nitride waveguides formed within a package allows for more flexibility, less optical loss, and improved optical signal routing. The photonic packages with built-in waveguides as described herein allows for high-speed optical signaling with power and performance enhancement. The disclosed photonic packages allow for the heterogeneous integration of III-V devices or devices of other material systems, such as laser diode devices. The use of chip-to-wafer direct bonding to form the laser diode as described herein can allow for the heterogeneous integration of laser diodes to silicon-photonic dies with reduced optical loss. Additionally, forming a laser diode on the back-side of the structure as described herein can improve the heat dissipation within a photonic package and improve device performance.

In accordance with some embodiments of the present disclosure, a method includes forming a first set of waveguides on a first side of a first dielectric layer, wherein the first set of waveguides includes a photonic device; forming a redistribution structure over the first set of waveguides, wherein the redistribution structure is electrically connected to the photonic device; forming a second set of waveguides on a second side of the first dielectric layer, wherein the first set of waveguides and the second set of waveguides are different materials; forming a second dielectric layer over the second set of waveguides; bonding a laser substrate die to the second dielectric layer using a dielectric-to-dielectric bonding process; and processing the laser substrate die to form a laser diode, wherein the laser diode is coupled to a waveguide of the second set of waveguides. In an embodiment, the first set of waveguides is silicon and the second set of waveguides is silicon nitride. In an embodiment, the photonic device includes a photodetector. In an embodiment, processing the laser substrate die includes etching the laser substrate die. In an embodiment, the laser diode laterally overlaps the waveguide of the second set of waveguides. In an embodiment, the method includes forming a third dielectric layer over the laser diode; and forming first vias penetrating the third dielectric layer, wherein at least one first via electrically contacts the laser diode. In an embodiment, the method includes forming second vias penetrating the second dielectric layer and the first dielectric layer, wherein at least one second via electrically contacts a first via and the redistribution structure. In an embodiment, the dielectric-to-dielectric bonding process includes physically contacting an oxide layer of the laser substrate die to the second dielectric layer. In an embodiment, the claim includes bonding a semiconductor die to the redistribution structure using fusion bonding, wherein the semiconductor die electrically contacts the redistribution structure.

In accordance with some embodiments of the present disclosure, a method includes forming a silicon waveguide over a top surface of an oxide layer, wherein the oxide layer is over a top surface of a substrate; forming a photonic device over the top surface of the oxide layer, wherein the photonic device is optically coupled to the silicon waveguide; forming a redistribution structure over the silicon waveguide and the photonic device, wherein the redistribution structure is electrically connected to the photonic device; bonding a semiconductor die to the redistribution structure, wherein the semiconductor die is electrically connected to the redistribution structure; removing the substrate to expose a bottom surface of the oxide layer; forming a first silicon nitride waveguide over the bottom surface of the oxide layer, wherein the first silicon nitride waveguide is optically coupled to the silicon waveguide; forming a dielectric layer over the first silicon nitride waveguide and over the bottom surface of the oxide layer; directly bonding a laser diode to the dielectric layer, wherein the laser diode is optically coupled to the first silicon nitride waveguide; and forming vias over the bottom surface of the oxide layer, wherein the vias are electrically connected to the laser diode and the redistribution structure. In an embodiment, a portion of the first silicon nitride waveguide laterally overlaps a portion of the silicon waveguide. In an embodiment, the method includes forming a second silicon nitride waveguide over the first silicon nitride waveguide, wherein the dielectric layer is over the second silicon nitride waveguide, wherein the laser diode is optically coupled to the first silicon nitride waveguide through the second silicon nitride waveguide. In an embodiment, the method includes attaching a support structure to the semiconductor die. In an embodiment, the method includes forming a grating coupler over the top surface of the oxide layer, wherein the grating coupler is optically coupled to the silicon waveguide. In an embodiment, the method includes replacing a portion of the redistribution structure with a dielectric material, wherein the dielectric material extends over the grating coupler. In an embodiment, the method includes performing a planarization process on the dielectric layer before directly bonding the laser diode to the dielectric layer.

In accordance with some embodiments of the present disclosure, a package includes a laser diode includes a bonding layer; a first dielectric layer over the laser diode, wherein the first dielectric layer is directly bonded to the bonding layer of the laser diode; a first silicon nitride waveguide in the first dielectric layer, wherein the first silicon nitride waveguide extends over the laser diode; a second dielectric layer over the first silicon nitride waveguide; a silicon waveguide in the second dielectric layer; an interconnect structure over the silicon waveguide; and conductive features extending through the first dielectric layer and the second dielectric layer to electrically contact the interconnect structure. In an embodiment, the package includes an electronic die physically and electrically connected to the interconnect structure. In an embodiment, the laser diode is surrounded by the first dielectric layer. In an embodiment, the package includes a second silicon nitride waveguide extending over the first silicon nitride waveguide, wherein the second dielectric layer extends over the second silicon nitride waveguide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
forming a first set of waveguides on a first side of a first dielectric layer, wherein the first set of waveguides comprises a photonic device;

forming a redistribution structure over the first set of waveguides, wherein the redistribution structure is electrically connected to the photonic device;

forming a second set of waveguides on a second side of the first dielectric layer, wherein the first set of waveguides and the second set of waveguides comprise different materials;

forming a second dielectric layer over the second set of waveguides;

bonding a laser substrate die to the second dielectric layer using a dielectric-to-dielectric bonding process; and after the bonding the laser substrate die to the second dielectric layer, processing the laser substrate die to form a laser diode, wherein the laser diode is optically coupled to a waveguide of the second set of waveguides, wherein the processing the laser substrate die comprises at least one photolithographic masking and etching process.

2. The method of claim 1, wherein the first set of waveguides comprises silicon and the second set of waveguides comprises silicon nitride.

3. The method of claim 1, wherein the photonic device comprises a photodetector.

4. The method of claim 1, wherein processing the laser substrate die comprises etching the laser substrate die.

5. The method of claim 1, wherein the laser diode laterally overlaps the waveguide of the second set of waveguides.

6. The method of claim 1 further comprising:
forming a third dielectric layer over the laser diode; and
forming a plurality of first vias penetrating the third dielectric layer, wherein at least one first via electrically contacts the laser diode.

7. The method of claim 6 further comprising forming a plurality of second vias penetrating the second dielectric layer and the first dielectric layer, wherein at least one second via electrically contacts a first via and the redistribution structure.

8. The method of claim 1, wherein the dielectric-to-dielectric bonding process comprises physically contacting an oxide layer of the laser substrate die to the second dielectric layer.

9. The method of claim 1 further comprising bonding a semiconductor die to the redistribution structure using fusion bonding, wherein the semiconductor die electrically contacts the redistribution structure.

10. A method comprising:
forming a silicon waveguide over a top surface of an oxide layer, wherein the oxide layer is over a top surface of a substrate;
forming a photonic device over the top surface of the oxide layer, wherein the photonic device is optically coupled to the silicon waveguide;
forming a redistribution structure over the silicon waveguide and the photonic device, wherein the redistribution structure is electrically connected to the photonic device;
bonding a semiconductor die to the redistribution structure, wherein the semiconductor die is electrically connected to the redistribution structure;
removing the substrate to expose a bottom surface of the oxide layer;
forming a first silicon nitride waveguide over the bottom surface of the oxide layer, wherein the first silicon nitride waveguide is optically coupled to the silicon waveguide;
forming a dielectric layer over the first silicon nitride waveguide and over the bottom surface of the oxide layer;
directly bonding a laser diode to the dielectric layer, wherein the laser diode is optically coupled to the first silicon nitride waveguide; and
forming vias over the bottom surface of the oxide layer, wherein the vias are electrically connected to the laser diode and the redistribution structure.

11. The method of claim 10, wherein a portion of the first silicon nitride waveguide laterally overlaps a portion of the silicon waveguide.

12. The method of claim 10 further comprising forming a second silicon nitride waveguide over the first silicon nitride waveguide, wherein the dielectric layer is over the second silicon nitride waveguide, wherein the laser diode is optically coupled to the first silicon nitride waveguide through the second silicon nitride waveguide.

13. The method of claim 10 further comprising attaching a support structure to the semiconductor die.

14. The method of claim 10 further comprising forming a grating coupler over the top surface of the oxide layer, wherein the grating coupler is optically coupled to the silicon waveguide.

15. The method of claim 14 further comprising replacing a portion of the redistribution structure with a dielectric material, wherein the dielectric material extends over the grating coupler.

16. The method of claim 10 further comprising performing a planarization process on the dielectric layer before directly bonding the laser diode to the dielectric layer.

17. A method comprising:
forming a silicon waveguide in a first dielectric layer;
forming a silicon nitride waveguide in a second dielectric layer, wherein the second dielectric layer is on a first side of the first dielectric layer;
forming an interconnect structure over a second side of the first dielectric layer;
forming first conductive features extending through the first dielectric layer and the second dielectric layer to electrically contact the interconnect structure;
bonding a laser diode to the second dielectric layer, comprising directly bonding a bonding layer of the laser diode to the second dielectric layer, wherein the laser diode extends over the silicon nitride waveguide; and
after the bonding the laser diode, patterning the laser diode to expose conductive connectors of the laser diode.

18. The method of claim 17 further comprising bonding an electronic die to the interconnect structure.

19. The method of claim 17 further comprising forming a third dielectric layer over the laser diode.

20. The method of claim 19 further comprising forming second conductive features extending through the third dielectric layer to electrically contact the laser diode.

* * * * *